United States Patent
Sutardja

(10) Patent No.: US 6,950,300 B2
(45) Date of Patent: Sep. 27, 2005

(54) ULTRA LOW INDUCTANCE MULTI LAYER CERAMIC CAPACITOR

(75) Inventor: Sehat Sutardja, Los Altos Hills, CA (US)

(73) Assignee: Marvell World Trade Ltd., St. Michael (BB)

(*) Notice: Subject to any disclaimer, the term of this patent is extended or adjusted under 35 U.S.C. 154(b) by 0 days.

(21) Appl. No.: 10/694,306

(22) Filed: Oct. 27, 2003

(65) Prior Publication Data

US 2004/0223290 A1 Nov. 11, 2004

Related U.S. Application Data

(60) Provisional application No. 60/468,380, filed on May 6, 2003, provisional application No. 60/468,876, filed on May 6, 2003, and provisional application No. 60/469,475, filed on May 8, 2003.

(51) Int. Cl.⁷ .......................... H01G 4/228; H01G 4/06
(52) U.S. Cl. ................... 361/306.3; 361/311; 361/309
(58) Field of Search .......................... 361/306.1–306.3, 361/309–312, 308.1, 308.2, 308.3, 321.1

(56) References Cited

U.S. PATENT DOCUMENTS

| | | | | |
|---|---|---|---|---|
| 3,603,902 | A | | 9/1971 | Denes |
| 4,853,826 | A | * | 8/1989 | Hernandez ............... 361/306.2 |
| 5,799,379 | A | * | 9/1998 | Galvagni et al. .......... 29/25.42 |
| 6,058,004 | A | | 5/2000 | Duva et al. |
| 6,072,687 | A | * | 6/2000 | Naito et al. ................. 361/303 |
| 6,208,501 | B1 | | 3/2001 | Ingalls et al. |
| 6,243,253 | B1 | * | 6/2001 | DuPre et al. ............. 361/306.3 |
| 6,262,877 | B1 | | 7/2001 | Mosley |
| 6,262,886 | B1 | * | 7/2001 | DiFonzo et al. ............ 361/683 |
| 6,282,079 | B1 | * | 8/2001 | Nagakari et al. ........... 361/303 |
| 6,282,095 | B1 | * | 8/2001 | Houghton et al. .......... 361/704 |
| 6,292,351 | B1 | | 9/2001 | Ahiko et al. |
| 6,327,134 | B1 | | 12/2001 | Kuroda et al. |
| 6,344,961 | B1 | | 2/2002 | Naito et al. |
| 6,396,713 | B1 | * | 5/2002 | Iwanami ..................... 361/794 |
| 6,483,692 | B2 | | 11/2002 | Figueroa et al. |
| 6,545,855 | B1 | | 4/2003 | Repplinger et al. |
| 6,549,395 | B1 | | 4/2003 | Naito et al. |
| 6,594,136 | B2 | * | 7/2003 | Kuroda et al. ........... 361/306.1 |
| 6,636,416 | B2 | * | 10/2003 | Li et al. .................. 361/306.1 |
| 2003/0026059 | A1 | | 2/2003 | Togashi |
| 2003/0030510 | A1 | * | 2/2003 | Sasaki et al. ............... 333/185 |
| 2004/0066603 | A1 | * | 4/2004 | Saito et al. ................ 361/302 |
| 2004/0174656 | A1 | * | 9/2004 | MacNeal et al. ........ 361/306.3 |

FOREIGN PATENT DOCUMENTS

EP          1 120 800 A2      1/2001

OTHER PUBLICATIONS

Copy of the European Search Report for European Application No. EP04010108, 2 pages.

"TDK Multilayer Ceramic Chip Capacitors", Application Manual, pp. 42, no date.

* cited by examiner

*Primary Examiner*—Eric W. Thomas

(57) ABSTRACT

A multilayer capacitor having a low parasitic inductance includes a first electrode, a second electrode, a dielectric, a first contact, and a second contact. The first electrode is substantially rectangular and it includes a first contact finger. The dielectric has a first surface and a second surface, wherein the first and second surfaces are situated opposite with each other. The first surface of the dielectric is coupled with the first electrode. The second electrode is substantially rectangular and it includes a first contact finger. The second electrode is coupled to the second surface of the dielectric. The first contact is coupled to the first contact finger of the first electrode. The second contact is coupled to the first contact finger of the second electrode. The second contact is situated at a minimal space from the first contact to reduce the parasitic inductance.

89 Claims, 18 Drawing Sheets

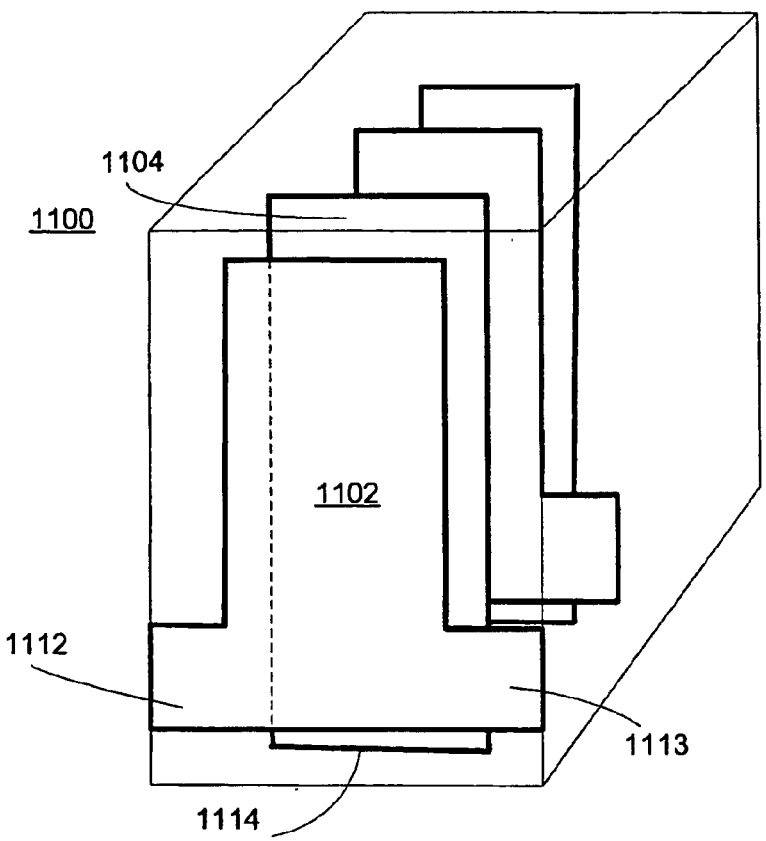
FIG 11A
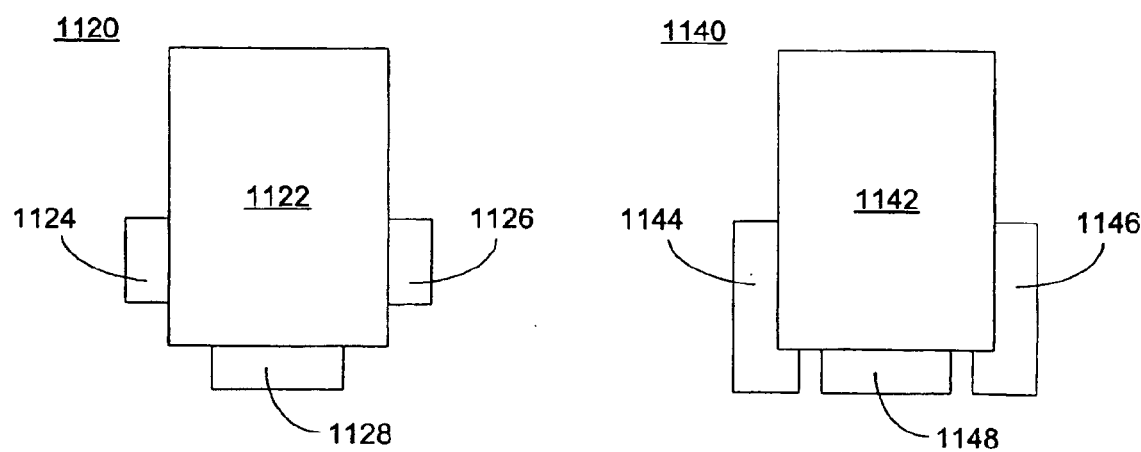
FIG 11B  FIG 11C

ULTRA LOW INDUCTANCE MULTI LAYER CERAMIC CAPACITOR

CROSS-REFERENCE TO RELATED APPLICATIONS

Pursuant to 35 U.S.C. 119(e) and 37 C.F.R. 1.78, the present application claims priority to the provisional applications entitled "Ultra Low Inductance Multi Layer Ceramic Capacitor Structures," Application No. 60/468,380, filed on May 6, 2003, Application No. 60/469,475, filed on May 8, 2003, and Application No. 60/468,876, filed on May 6, 2003, all of which are hereby incorporated by reference.

FIELD OF THE INVENTION

The present invention relates to the field of electronic devices. More specifically, the present invention relates to ceramic capacitors.

BACKGROUND

With the increasing performance of computers and network communications, demand for high speed and high-density integrated circuits is increasing. Such high performance integrated circuits ("ICs") tend to require more sophisticated noise filtering techniques such as decoupling capacitors to enhance the reliability of the devices. Decoupling capacitors are typically placed close to power supplies such as $V_{dd}$ and/or ground. Decoupling capacitors reduce the noise and smooth fluctuations in power supply voltage.

Decoupling capacitors are typically mounted on the printed circuit board ("PCB") in close proximity to the ICs. As the switching speeds of ICs increase, greater demands are placed on decoupling capacitors. FIG. 1A illustrates a conventional decoupling capacitor 100. Capacitor 100 includes a main body 106 and two end portions 102–104. A typical physical size of a capacitor 100 is a rectangular structure with W (width)×L (length)×H (height), wherein L is typically the longest and H is the shortest in the structure. The two end portions 102–104 provide voltage potentials, also known as +poles/−poles, for capacitor 100. The structure of capacitor 100 is typically referred to as an axial structure. FIG. 1B is a side view 140 of capacitor 100 shown in FIG. 1A in which a capacitor 150 is mounted on a PCB 152. Typically, wires or terminals 162–164 are used to connect capacitor 150 to PCB 152.

Industry has met the demands for greater decoupling capacitors by employing larger and larger capacitors. However, a problem with a conventional capacitor is parasitic inductance. Typically, the larger the capacitor is in size, the larger the parasitic inductance becomes. Parasitic inductance degrades the effectiveness of a capacitor. Capacitors with large parasitic inductance have low resonance frequency making them unusable for many high-speed common applications. For example, it is common to find low power DC/DC or DC-to-DC converters operating at 1 MHz and some even operate at up top 2 MHz. However, high power DC/DC converters are still operating at about ⅒ of the lower power counterparts. One reason is related to the resonance frequency of large capacitors. Large value multilayer ceramic capacitors typically have resonance frequencies of less than 500 kHz versus smaller value multilayer ceramic capacitors with resonance frequencies of greater than 2 MHz. The relationship between resonance frequencies and capacitance can be expressed in the following equation:

$$f = \frac{1}{2\pi (LC)^{1/2}}$$

wherein f represents resonance frequency, L represents parasitic inductance, also known as equivalent series inductance ("ESL"), and C represents capacitance. As can be seen, the smaller the inductance L, the higher the resonance frequency f becomes.

Thus, it would be desirable to have a multilayer capacitor that provides high capacitance with small parasitic inductance.

SUMMARY OF THE INVENTION

A multilayer capacitor having a parallelepiped shape with low parasitic inductance is disclosed. To maintain a low parasitic inductance in a multilayer ceramic capacitor, the external contact terminals of the capacitor, in one embodiment, need to be placed as closer as possible before the occurrence of electrical crosstalk between the external contact terminals. In other words, a reduction of the physical distance between the external contact terminals of a capacitor causes to decrease the parasitic capacitance.

In one embodiment, a multilayer capacitor having low parasitic inductance includes first and second electrode plates, a dielectric material, a first contact, and a second contact. The first electrode plate is substantially rectangular and it includes at least one contact finger. The dielectric material has first and second surfaces wherein the first and second surfaces are situated opposite each other. The first surface of the dielectric material is coupled with the first electrode plate in substantially parallel and the second electrode plate is substantially rectangular and it also includes at least one contact finger. The second electrode plate is coupled to the second surface of the dielectric material. The first contact is coupled to the contact finger of the first electrode plate. The second contact is coupled to the contact finger of the second electrode plate. The second contact is situated at a predefined minimal distance from the first contact to maintain a minimum parasitic inductance.

Additional features and benefits of the present invention will become apparent from the detailed description, figures and claims set forth below.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

FIGS. 11A-C illustrate another stacking configuration in accordance with one embodiment of the present invention;

DETAILED DESCRIPTION

Figure 1A:
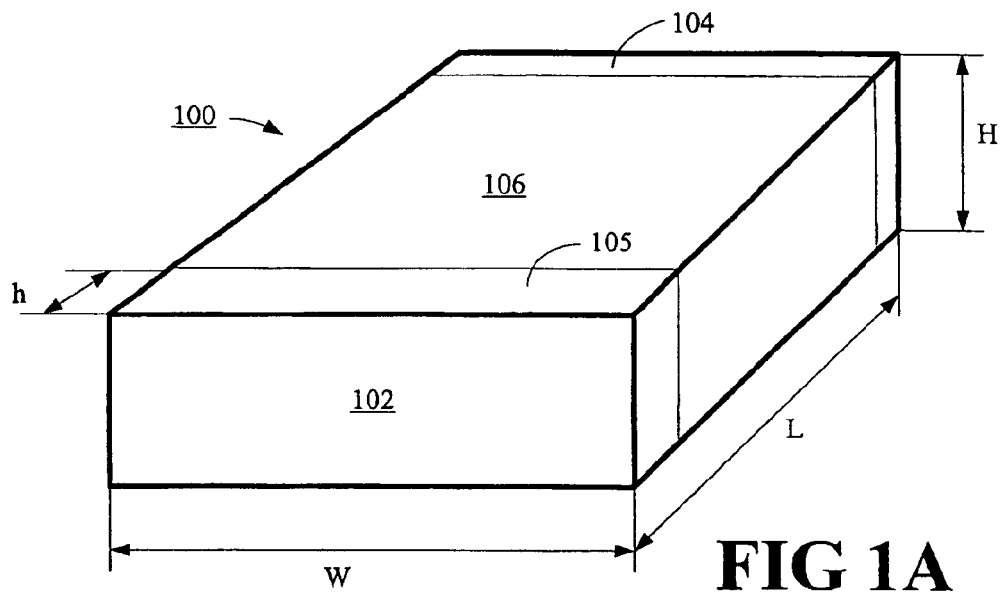
FIGS. 1A–B illustrate a conventional capacitor.
Figure 1B:
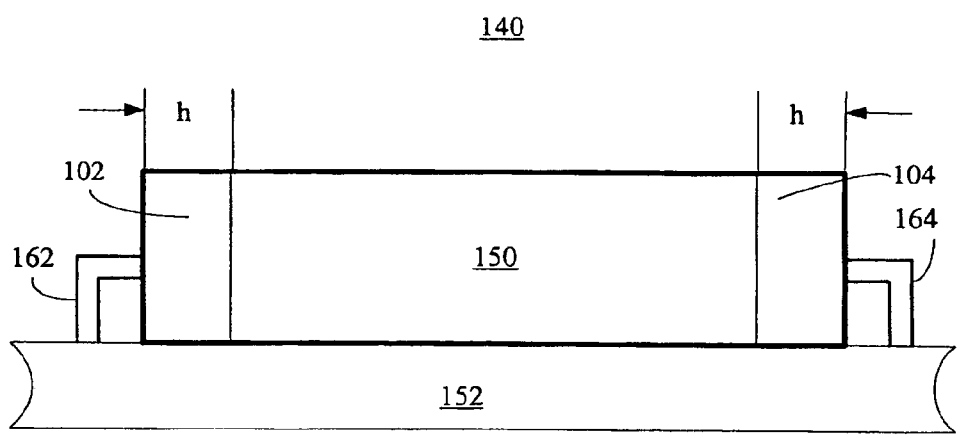

In the following description of the embodiments, substantially the same parts are denoted by the same reference numerals.

A multilayer capacitor having a parallelepiped shape with low parasitic inductance is disclosed. In order to maintain a low parasitic inductance in a multilayer ceramic capacitor, the external contact terminals of the capacitor, in one embodiment, need to be placed as close as possible before the occurrence of electrical crosstalk between the external contact terminals and to decrease the parasitic inductance. In other words, a reduction of the physical distance between the external contact terminals of a capacitor causes to decrease the parasitic inductance.

Figure 2A:
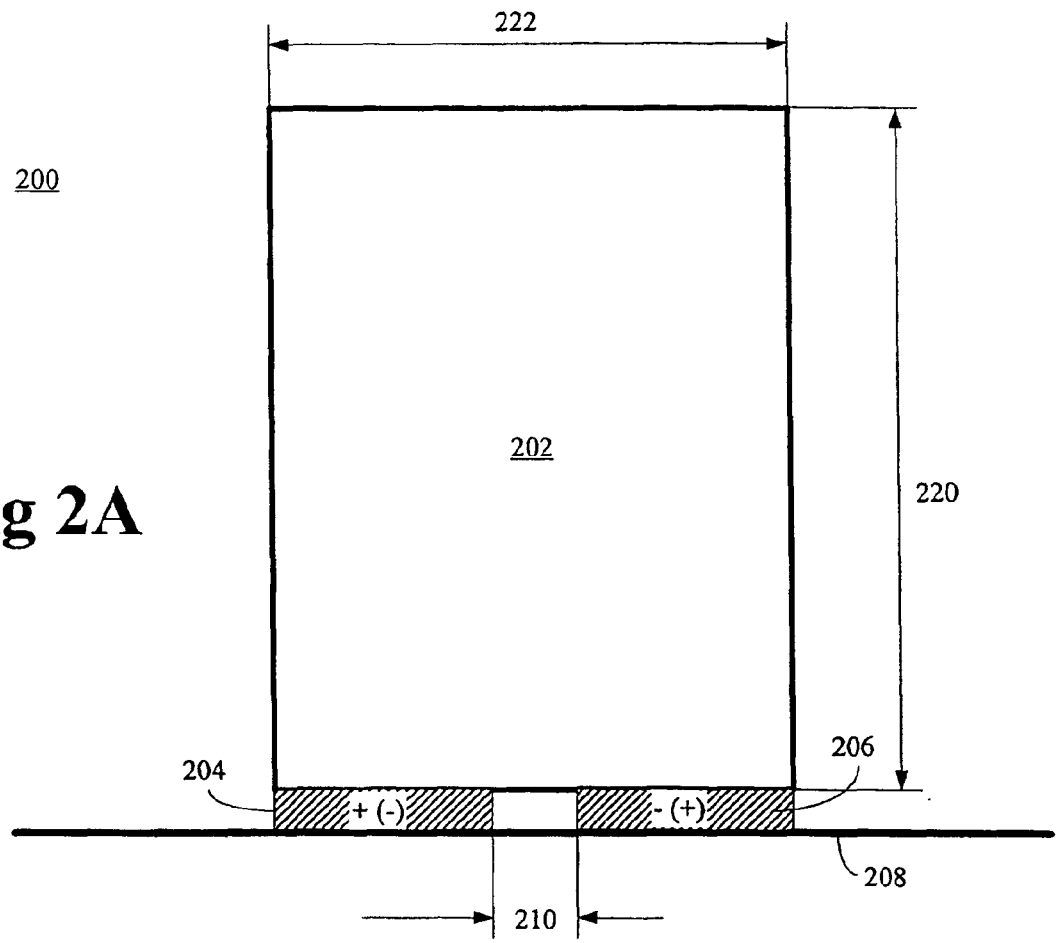
FIGS. 2A–2B are block diagrams illustrating a multilayer capacitor in accordance with one embodiment of the present invention.

FIG. 2A is a block diagram 200 illustrating a multilayer capacitor 202, which is mounted on a printed circuit board 208. In one embodiment, capacitor 202 includes two external contacts or contact terminals 204 and 206. Contact bar or terminal 204 is used as a terminal of one polarity while contact terminal 206 is used as a terminal of the other polarity of capacitor 202. In one aspect, the width 222 of capacitor 202 is shorter than the height 220 of capacitor 202. The predefined minimal distance 210 is employed between contact terminals 204 and 206 to minimize the parasitic inductance. The distance 210 between the two opposite polarities of the contact bars 204–206 affects the parasitic inductance. The shorter the distance 210 between the opposite polarity contact bars 204–206, the smaller the parasitic inductance becomes. This structure also reduces effective series resistance. Preferably the distance 210 is less than 12 mils. and more preferably less than 8 mils.

Figure 2B:
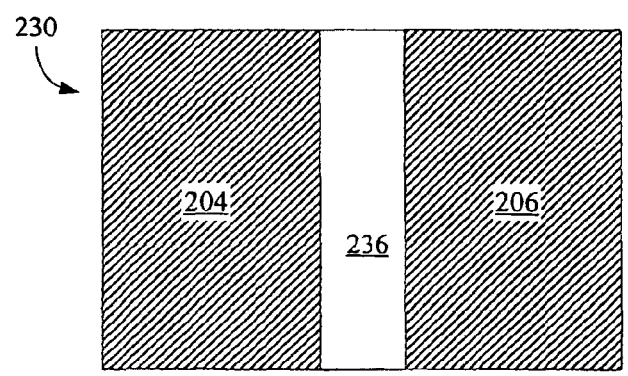

FIG. 2B is a configuration 230 showing a bottom view of contact terminals 204 and 206 of FIG. 2A. Contact terminals 204 and 206 are separated by a predefined area or distance 236 to keep the parasitic inductance minimum. In one embodiment, to reduce parasitic inductance of a capacitor, the distance 210 should be kept to a minimal length. Distance 210 is also referred to predefined minimal distance. In one embodiment, a predefined minimal distance is a minimal distance to separate the different polarity external contacts. As discussed earlier, the distance 236 between the two polarities of the contact bars 204 and 206 affects the parasitic inductance. The shorter the distance between the opposite polarity contact terminals, the smaller the parasitic inductance becomes.

Referring again to FIGS. 2A and 2B, the structure of capacitor 202, in one aspect, is referred to as a radial structure because the radial structure of the multilayer capacitor can be considered as having rotated an axial structure by 90 degrees and then moved both terminals to one side of the capacitor instead of located at the ends of an axial structured capacitor. An advantage of the radial structured capacitor is its ability to arrange the external contacts closer together with minimum separation. The reduced distance between the external contacts reduces parasitic inductance. In other words, a radial structured capacitor provides low parasitic inductance partially due to the small distance 210 between the terminals.

Figure 3A:
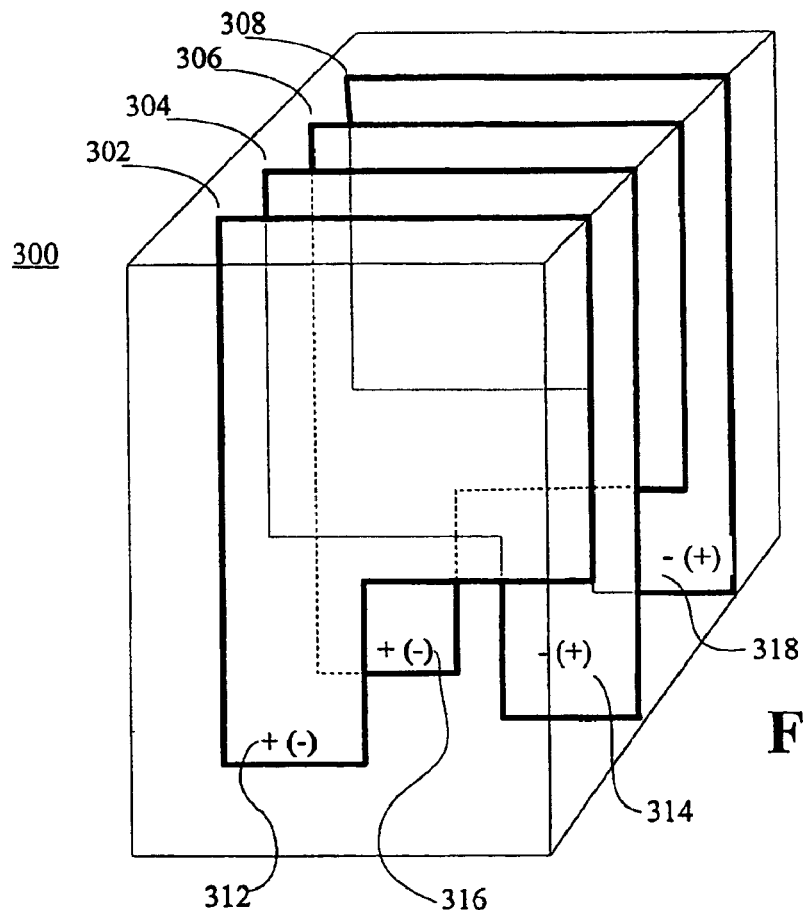
FIGS. 3A–3C illustrate multiple electrode plates for a multilayer capacitor in accordance with one embodiment of the present invention.
Figure 3B:
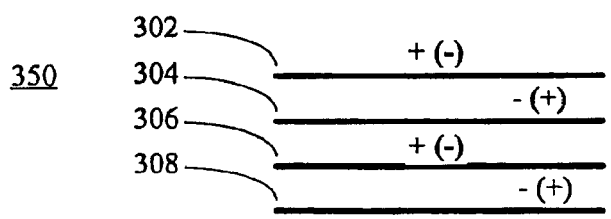
Figure 3C:
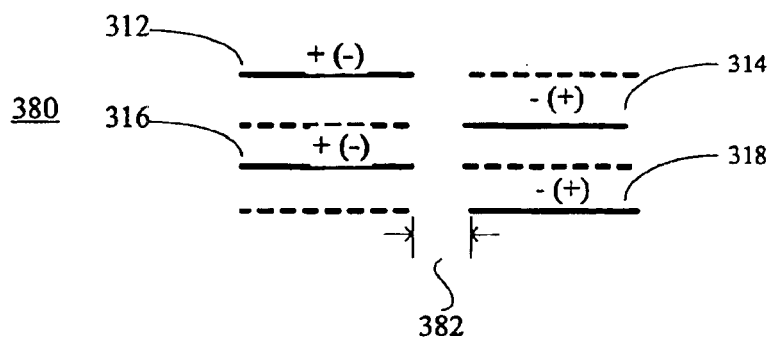

FIGS. 3A–3C are diagrams illustrating various views of electrode plates in accordance with one embodiment of the present invention. FIG. 3A is a perspective view of electrode plates 302–308 for a multilayer radial structured capacitor Electrode plates 302–308 further include contact fingers or extensions 312–318, respectively. It should be noted that the dimensions of electrode plates 302–308 and contact fingers 312–318 shown in FIG. 3A are not to scale. In one embodiment, electrode plates 312 and 316 are to be connected to the voltage potential the first polarity while electrode plates 314 and 318 are to be connected to the voltage potential of the other polarity. It should be noted that a dielectric material (not shown in FIG. 3A) is disposed between the electrode plates 302–308. It should be noted that the number of electrode plates 302–308 shown in FIG. 3A is illustrative. In one embodiment, electrode plates 412–418 include one or more of copper, nickel, aluminum, and other alloy metals.

FIG. 3B shows a top view of the electrode plates 302–308. FIG. 3C shows a bottom view of the electrode plates 302–308. In one embodiment, electrode plates 302 and 306 carry charges of one polarity while electrode plates 304 and 308 carry charges of the other polarity. FIG. 3C shows four contact fingers 312–318 wherein contact fingers 312 and 316 are to be connected to the voltage potential of one polarity while contact fingers 316 and 318 are to be connected to the voltage potential of the other polarity. It should be noted that the gap 382, in one embodiment, affects the value of parasitic inductance. Preferably the gap 382 is less than 12 mils. and more preferably less than 8 mils.

Figure 4A:
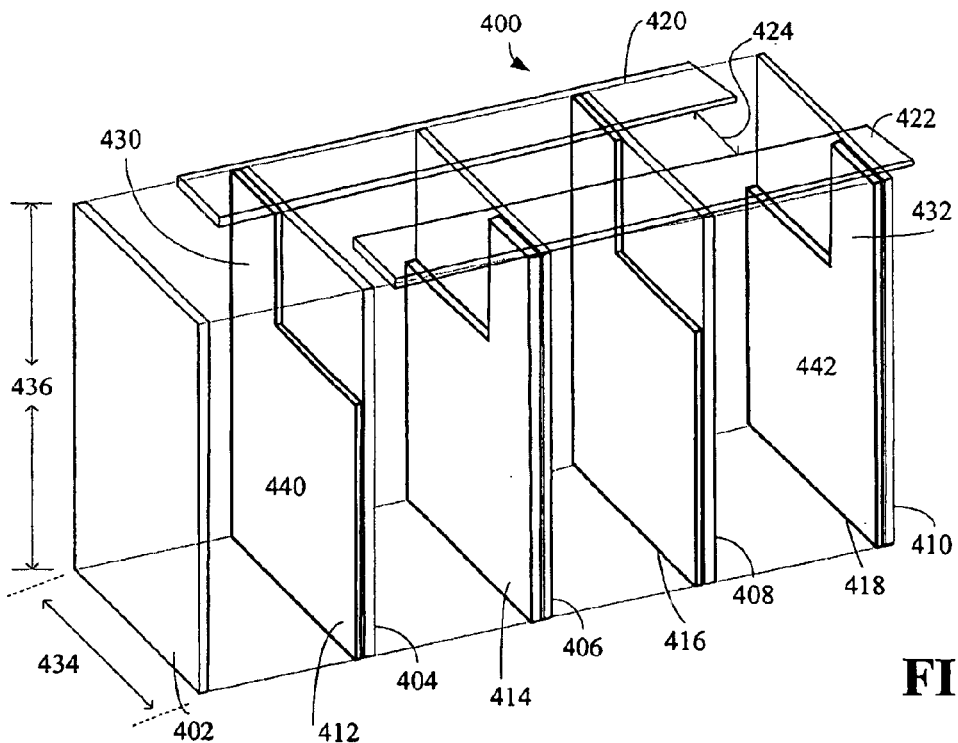
FIG. 4A is an exploded perspective view of a multilayer capacitor in accordance with one embodiment of the present invention.

FIG. 4A is an exploded perspective view of a multilayer capacitor 400 in accordance with one embodiment of the present invention. Capacitor 400 includes a plurality of first and second electrode plates 412–418 and dielectric materials 402–410. Dielectric material such as ceramic compound, in one embodiment, is sandwiched between the electrode plates. It should be noted that the dimensions of dielectric materials 402–410 shown in FIG. 4A are illustrative and not to the scale. Capacitor 400 further includes a first and second external contacts 420 and 422 for providing electrical connections. It should be noted that the underlying concept of the present invention does not change if plates are added or removed from capacitor 400.

Referring to FIG. 4A, each first electrode 412 or 416, also known as first internal electrode or electrode plate, includes a first portion 440 and a second portion or extension 430. The first portion 440 is the main body of the first electrode 412. The second portion 430 is a contact finger. In one embodiment, the width 434 of capacitor 400 is shorter than the height 436 of capacitor 400. It should be noted that contact fingers 430 shown in FIG. 4A are not drawn to scale and they are merely illustrative. It should be further noted that first electrodes 412 may include more contact fingers.

Similarly, each second electrode 414 or 418 includes a first portion 442 and a second portion or extension 432. The first portion 442 is the main body of the second electrode 418. The second portion 432 is a contact finger. In one embodiment, contact fingers 430–432 are used to provide electrical connections to first and second external contacts 420 and 422. The distance 424 between first and second external contacts 420 and 422 is minimized to reduce the parasitic inductance.

Dielectric materials 402–410, also referred to as ceramic layers or dielectric, are sandwiched between first and second electrode plates 412–418. In one embodiment, dielectric materials 402–410 are made of one or more of barium titanate, titanium, zirconate, and other types of ceramic materials.

First external contact 420, also known as external terminal or external lead, is perpendicular to electrode plates 412–418 and electrically connects to contact fingers 430 of first electrode plates 412 and 416. First external contact 420 is used to provide electrical connection between first electrodes 412, 416 and other device(s) via various connection media such as the printed circuit board or wires. In one embodiment, first external contact 420 is configured to connect to the printed circuit board. In another embodiment, first external contact 420 is configured to connect to a device, such as another capacitor or inductor. For example, reference is made to FIGS. 9D and 10C, in which stacked radial capacitor are described herein below. Second external contact 422, also known as the external terminal or external lead, are also positioned perpendicularly to electrode plates 412–418 and electrically connect to contact fingers 432 of second electrode layers 414, 418. Second external contact 422 is used to provide electrical connection between second electrodes 412, 416 and other device(s). In one embodiment, second external contact 422 is configured to connect to the printed circuit board. In another embodiment, second external contact 422 is configured to connect to a device, such as another capacitor.

The distance 424 also referred to, as minimal space or minimal distance or predefined minimal distance, is the physical distance between first external contact 420 and second external contact 422.

Figure 4B:
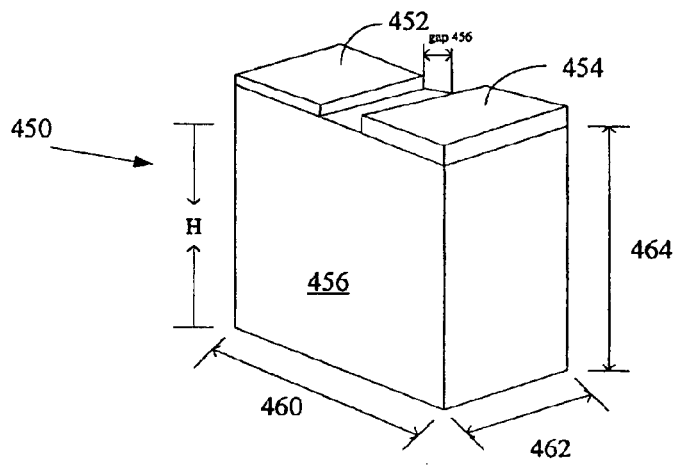
FIG. 4B is a block diagram of a multilayer capacitor in accordance with one embodiment of the present invention.

FIG. 4B is a configuration of a multilayer capacitor 450 in accordance with one embodiment of the present invention. Capacitor 450 includes external contacts 452–454, a gap 456, and a main body 456. In one embodiment, external contacts 452–454 correspond to external contacts 420–422 as shown in FIG. 4A. Similarly, the width of gap 456 corresponds to minimal space 424 shown in FIG. 4A. In this embodiment, the width 460 of capacitor 450 is shorter than the height of capacitor 464. In another embodiment, the height 464 is longer than the length 462 of capacitor 450. One of the benefits of the present invention relates to the ability to conserve footprint space on the PCB. It should be noted that it does not depart from the underlying concept of the present invention if contact fingers are added or removed.

Figure 5:
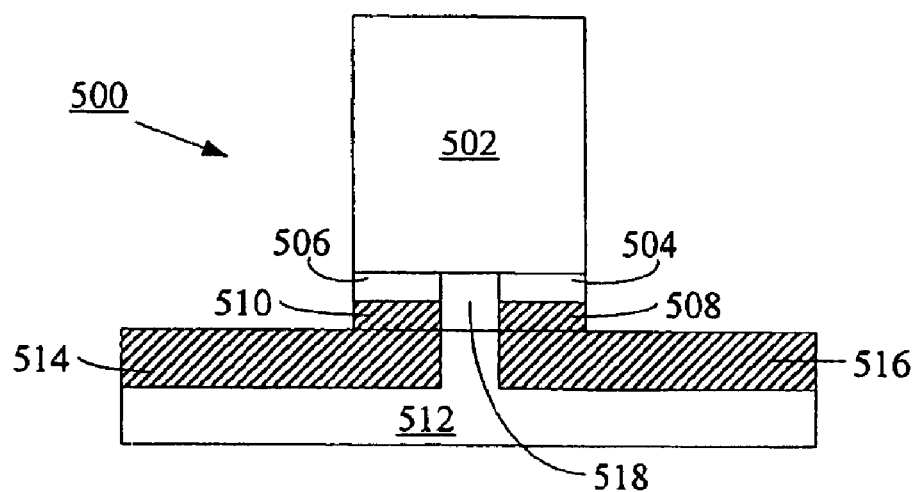
FIG. 5 is a block diagram illustrating a multiplayer capacitor that is mounted on a printed circuit board in accordance with one embodiment of the present invention.

FIGS. 5 is a block diagram illustrating a multilayer capacitor mounted on a printed circuit board in accordance with one embodiment of the present invention. Referring to FIG. 5, block diagram 500 includes a capacitor 502 and a printed circuit board 512 connected through contacts 504–510. In one embodiment, capacitor 502, which is a multilayer ceramic capacitor, includes a first external contact 506 and second external contact 504. To reduce the parasitic inductance, external contacts 504–506 are set apart of a minimal distance 518. Printed circuit board 512 includes metal traces 514–516 and metal contacts 508–510 for connecting to capacitor 502. It should be noted that the underlying concept of the present invention would not change if printed circuit board 512 includes multiple layers of metal traces.

In one embodiment, capacitor 502 is mounted by soldering it to the printed circuit board 512 using surface mounting techniques. In another embodiment, capacitor 502 may be mechanically mounted onto the printed circuit board 512 through glue or other adhesive materials. An advantage of employing this type of mounting technique for a decoupling capacitor is easy to mount and easy to rework.

Figure 6A:
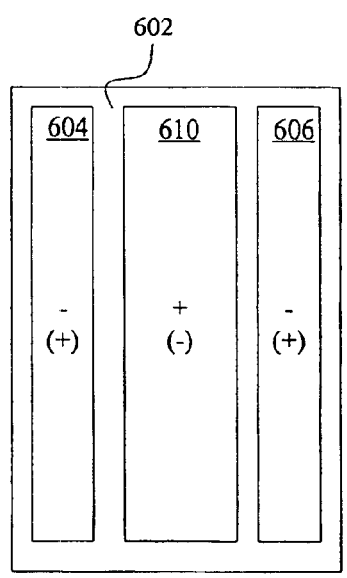
FIGS. 6A–H are block diagrams illustrating contact terminals for a capacitor in accordance with embodiments of the present invention.

FIGS. 6A–D are block diagrams illustrating contact terminals for capacitors in accordance with alternative embodiments of the present invention. Referring to FIG. 6A, block diagram 600 illustrates a bottom view of the capacitor with a bar structure having three contact bars 604–610. In one embodiment, the electrode plates of one polarity of capacitor are connected to the outer bars 604–606 and the electrode plates of the other polarity are connected to the inner bar 610. In other words, one of the contact terminals is placed at the center bar of the capacitor with the other contact terminal being split into two parts and disposed at the outer edge of capacitor 600. The bar structure provides low series resistance for the external contacts. For some applications such as DC/DC converters, minimizing series resistance is necessary in order to achieve a relatively high performance DC/DC converter. Furthermore, a high performance DC/DC converter or voltage regulator needs to minimize not only the internal series resistance, but also the series resistance generated through trace and vias associated with the printed circuit board. In one aspect, the bar terminal structures reduce the combined series resistance for the printed circuit board and the capacitor.

Higher order bar structures could be employed to create interleaved contact terminals for a capacitor. It should be further noted that while the radial structure of multilayer capacitor according to the present invention incrementally reduces the series parasitic inductance, the effective series resistance increases, as less contact surface is available for the terminals themselves. Accordingly, it is an advantage of the present invention that a higher number of external contacts may be used for large capacitors.

Figure 6B:
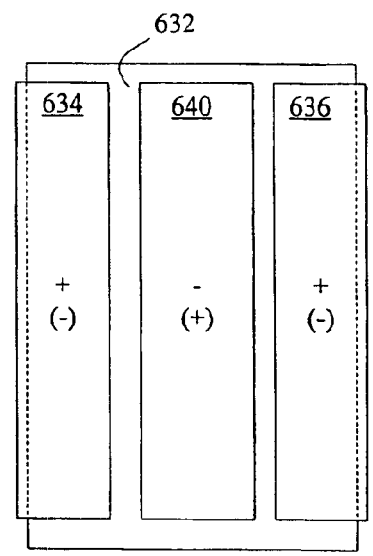

Referring to FIG. 6B, block diagram 630 illustrates another embodiment of external contacts 632 having three contact bars 634–640 in a bar structure. In one embodiment, the electrode plates of one polarity of the capacitor are connected to the inner finger 640 and the electrode plates of the other polarity are connected to the outer bars 634–636. External contact 632 illustrates a technique of expanding the contact surface such as bars 634–636 beyond the surface of capacitor 632 and wrapping the contact surface around the corner of the main body of capacitor 632. It should be noted that by increasing the contact surface area, the equivalent series resistance ("ESR") is decreased, which advantageously enhances the capacitor's performance. For a given bottom surface area of a conventional capacitor, this technique can increase the surface area by 30%. Another benefit of using an expanded contact surface is to create a stronger connection between the capacitor and the printed circuit board. In another embodiment, two contact bars 634–636 are arranged to expand beyond the surface of capacitor 632 and then wrap around the corners of the capacitor 632 to further increase the contacting area for reducing the resistance.

Figure 6C:
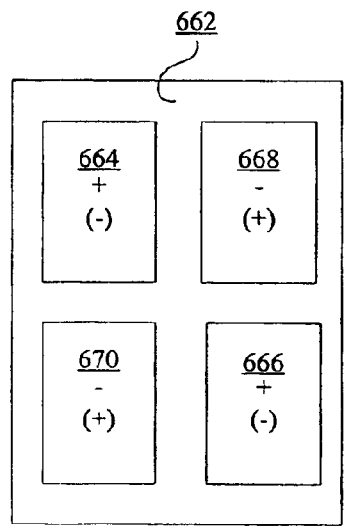
Figure 6D:
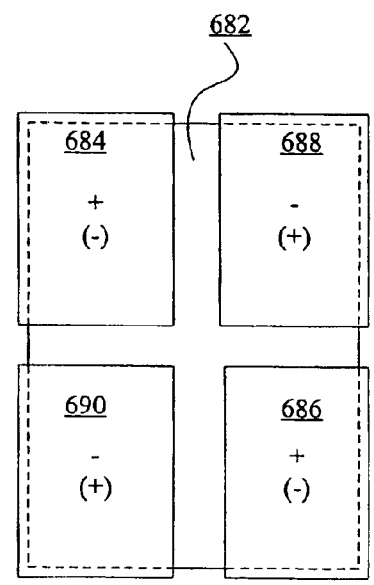

FIG. 6C illustrates a higher order configuration 660 of contact bars. Configuration 660 illustrates an alternative arrangement of contact bars 664–670. In one embodiment, the space between contact bars 664–670 is minimized to reduce the parasitic inductance of capacitor 632. FIG. 6D illustrates a configuration 680 of the contact bars 684–690 for capacitor 682. The large contacting surface of contact bars 684–690 provides low ESR of configuration 680. It should be noted that it does not depart from the present invention if the high order of the contact bars increases beyond four bars. In one embodiment, contact bars 684–690 are arranged to expand beyond the surface of capacitor 682 and then wrap around the corners of the capacitor 682 to further increase the contacting area for reducing the resistance.

A radial structured capacitor, in one embodiment, is used for performing a function of filtering in a high-powered DC/DC converter. A DC/DC converter, also known as DC-to-DC converter, is a device that accepts a DC input voltage and produces a DC output voltage. Usually, the output produced is at a different voltage level than the input. In another application, DC/DC converters may be used to provide noise isolation and/or power regulation, etc.

Figure 6E:
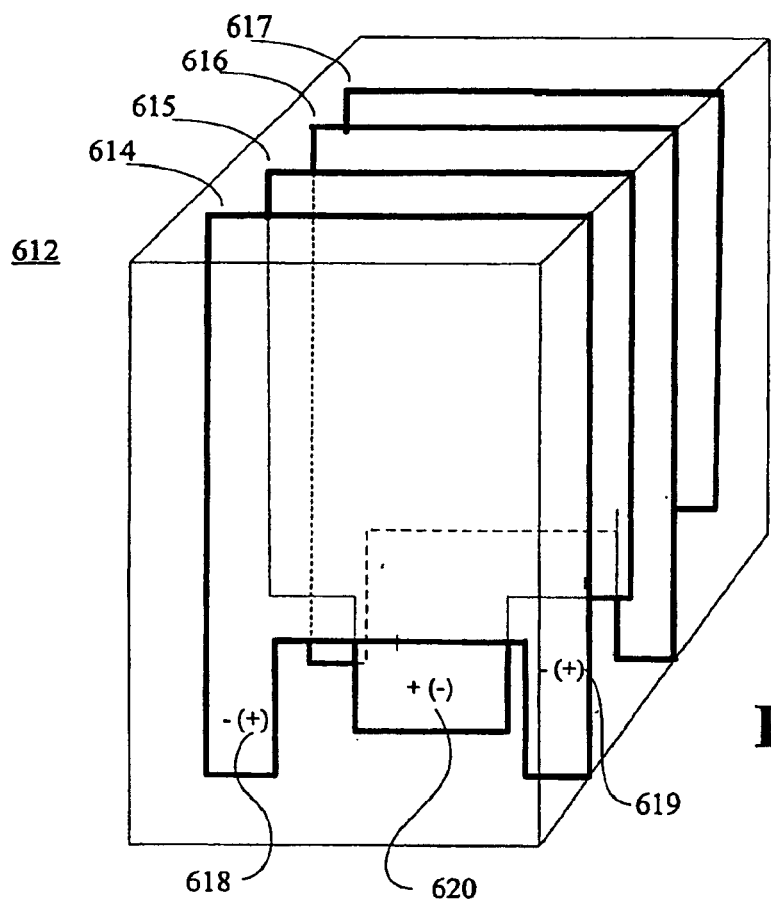

FIG. 6E is an exploded perspective view of a multilayer capacitor for the configuration illustrated in FIG. 6A in accordance with one embodiment of the present invention. Electrode plates 614 and 616 include contact fingers 618–619 and electrode plates 615 and 617 include contact finger 620. It should be noted that the dimensions of electrode plates 614–617 and contact fingers 618–620 shown in FIG. 6E are not to scale. The benefit and advantages for the underlying invention are realized if contact fingers 618–619 are sized a little smaller or bigger in relation to electrode plates 614–617. In one embodiment, electrode plates 615 and 617 are to be connected to one polarity and electrode plates 614–616 are to be connected to the other polarity. It should be noted that there should be space or dielectric materials (not shown in FIG. 6E) inserted between the electrode plates 614–617. It should also be noted that the number of electrode plates 614–617 shown in FIG. 6E is illustrative. In one embodiment, electrode plates 614–617 are made of one or more of copper, nickel, aluminum, and other alloy metals.

Figure 6F:
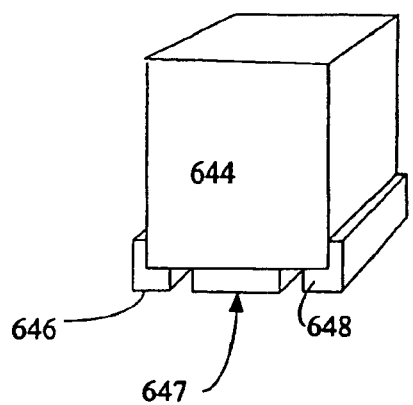

FIG. 6F illustrates a capacitor 642 having external contact bars 646–649 similar to the contact configuration 632 illustrated in FIG. 6B in accordance to one embodiment of present invention. In one embodiment, the main body 644 of capacitor 642 includes a plurality of electrode plates 614–617 as illustrated in FIG. 6E. External contacts 646–648 wrap around the corner of the main body 644 for maximizing the contact area. In this embodiment, external contacts 646–648 is connected to one polarity and external contact 649 is connected to the other polarity.

Figure 6G:
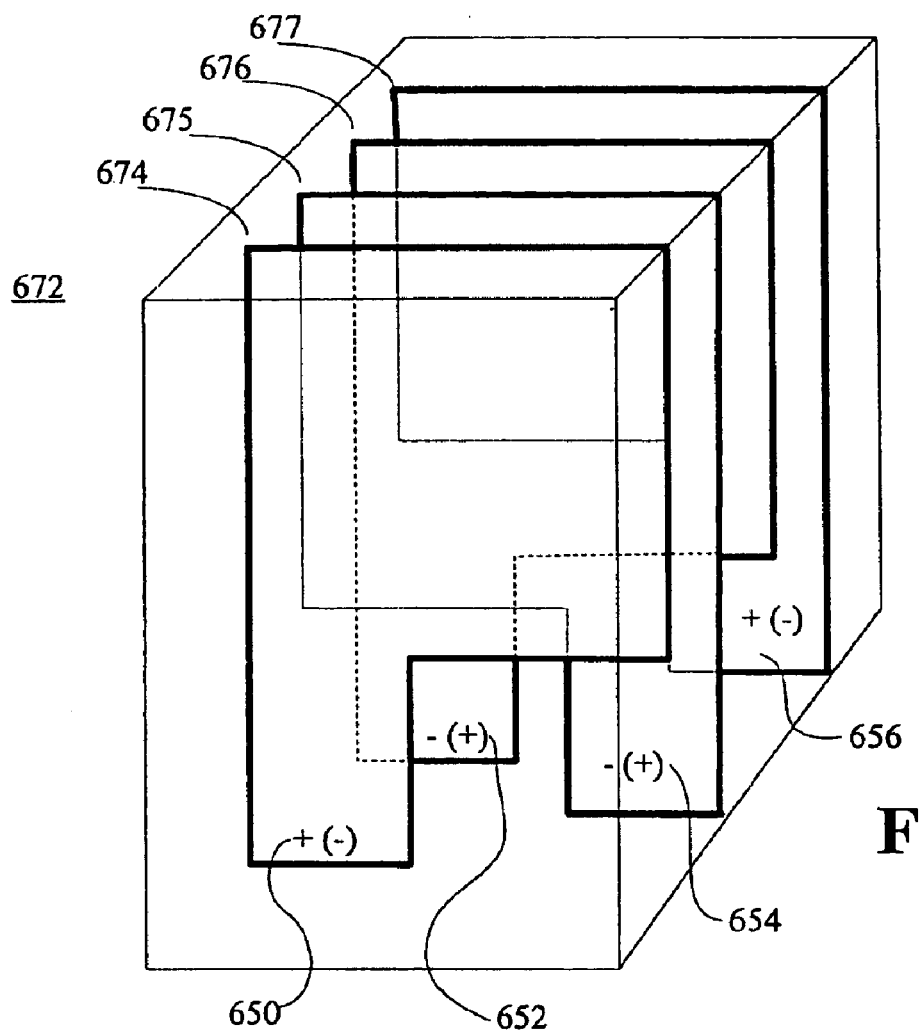

FIG. 6G is an exploded perspective view of a multilayer capacitor for the configuration illustrated in FIG. 6C in accordance with one embodiment of the present invention. Electrode plates 674–677 include contact fingers 650–656 wherein electrode plates 674 and 677 is connected to one polarity and electrode plates 675–676 is connected to the other polarity. It should be noted that the dimensions of electrode plates 674–677 and contact fingers 650–656 shown in FIG. 6G are not to scale. The benefit and advantages for the underlying invention are realized if contact fingers 650–656 are sized a little smaller or bigger in relation to electrode plates 674–677. It should be noted that there should be space or dielectric materials (not shown in FIG. 6G) inserted between the electrode plates 674–677. It should also be noted that the number of electrode plates 674–677 shown in FIG. 6G is illustrative. In one embodiment, electrode plates 674–677 are made of one or more of copper, nickel, aluminum, and other alloy metals.

Figure 6H:
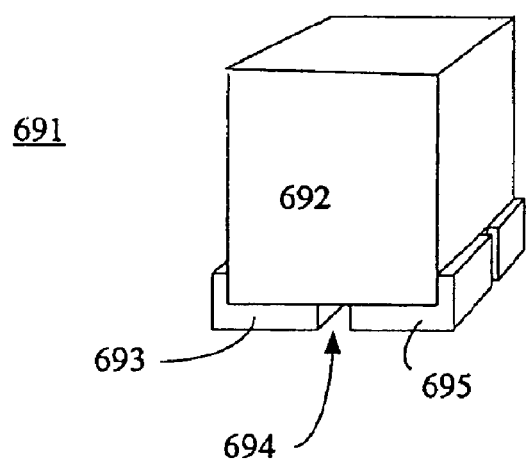

FIG. 6H illustrates a capacitor 691 having external contact bars 693–696 similar to the contact configuration 682 illustrated in FIG. 6D in accordance to one embodiment of present invention. In one embodiment, the main body 692 of capacitor 691 includes a plurality of electrode plates 674–677 as illustrated in FIG. 6G. External contacts 693–696 wrap around the corner of the main body 692 to maximize the contact area. It should be noted that external contact bars 693–695, in one embodiment, wrap around the front and back sides of the main body 692.

Figure 7A:
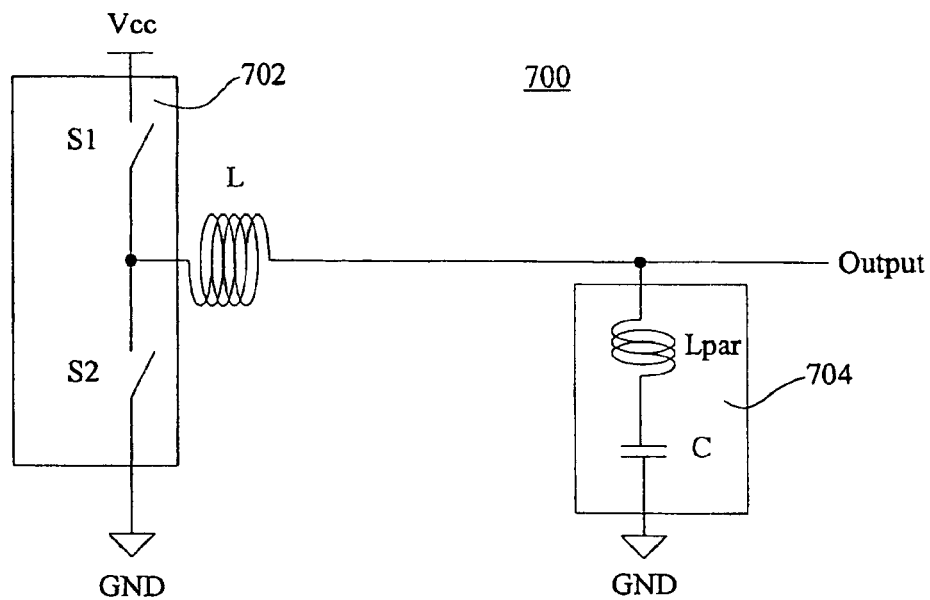
FIG. 7A is a schematic diagram illustrating a DC-to-DC converter using a multilayer capacitor in accordance with one embodiment of the present invention.

FIG. 7A is a schematic diagram illustrating a DC-to-DC converter 700 using a multilayer capacitor C in accordance with one embodiment of the present invention. Converter 700 includes a switching power supply 702, inductor L, and capacitor 704. Switching power supply 702 further includes a first switch S1, a second switch 2 S2, Vcc, and ground voltage potential. Moreover, capacitor 704 has a capacitance C and parasitic inductance $L_{par}$. In operation, inductor L smoothes current fluctuation and capacitor 704 smoothes voltage fluctuation at the output. It should be noted that converter 700 may also be referred to as DC-to-DC voltage regulator.

Figure 7B:
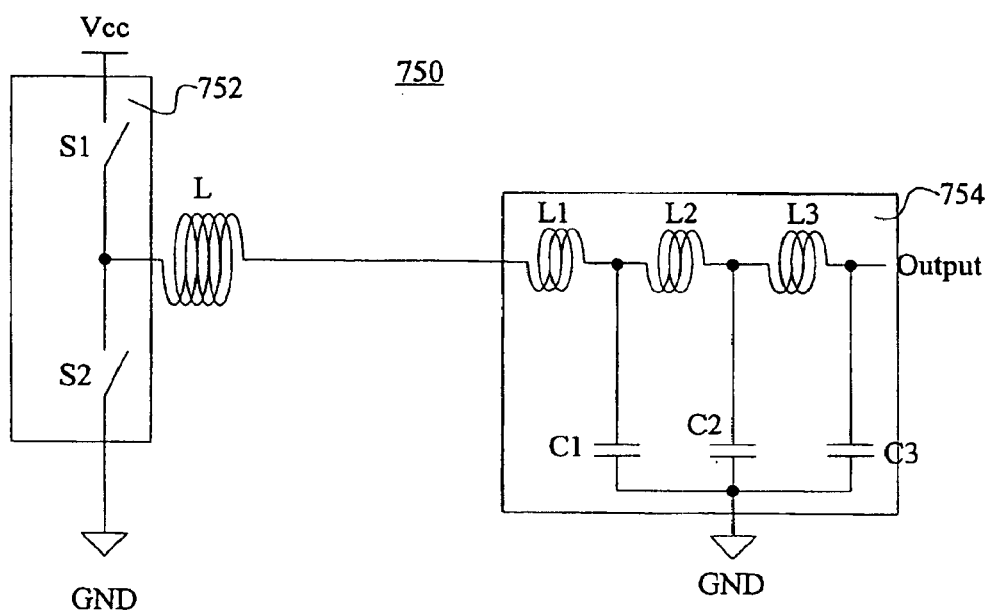
FIG. 7B is a schematic diagram illustrating a multilayer capacitor having parasitic inductance in a DC-to-DC converter in accordance with one embodiment of the present invention.

FIG. 7B illustrates another configuration of a DC/DC converter 750. Converter 750 includes a switching power supply 752, inductor L, and capacitor 754. Converter 750 is sometimes referred to as an LC configuration. Switching power supply 752 further includes a first switch S1, a second switch S2, Vcc, and ground voltage potential GND. Capacitor 754 includes three capacitance components C1, C2, C3 with parasitic inductance L1, L2, L3, respectively. Capacitance components C1, C2, C3 are connected in parallel to increase the overall capacitance of capacitor 754. In operation, inductor L smoothes current fluctuation and capacitor 754 smoothes voltage fluctuation at the output.

Figure 8A:
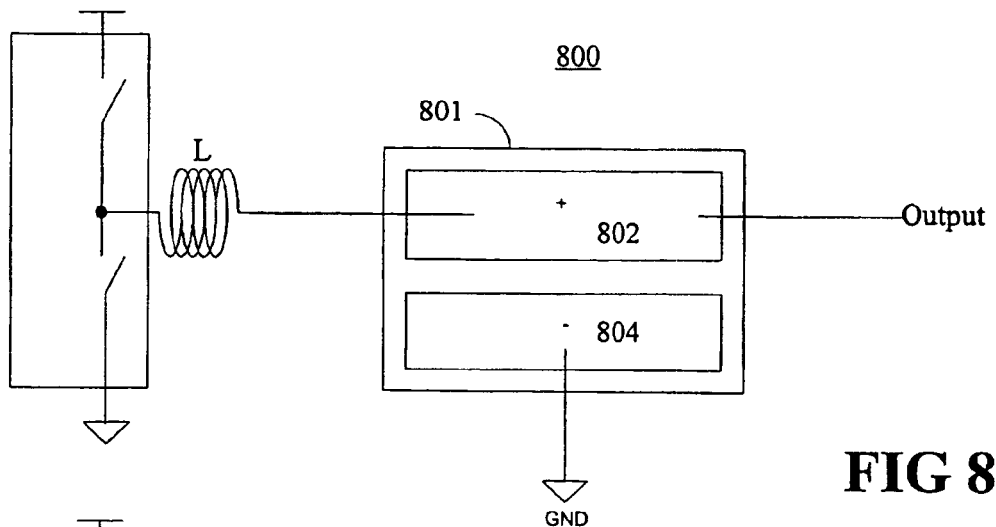
FIGS. 8A–C are block diagrams illustrating connections of capacitor in DC-to-DC converters in accordance with embodiments of the present invention.
Figure 8B:
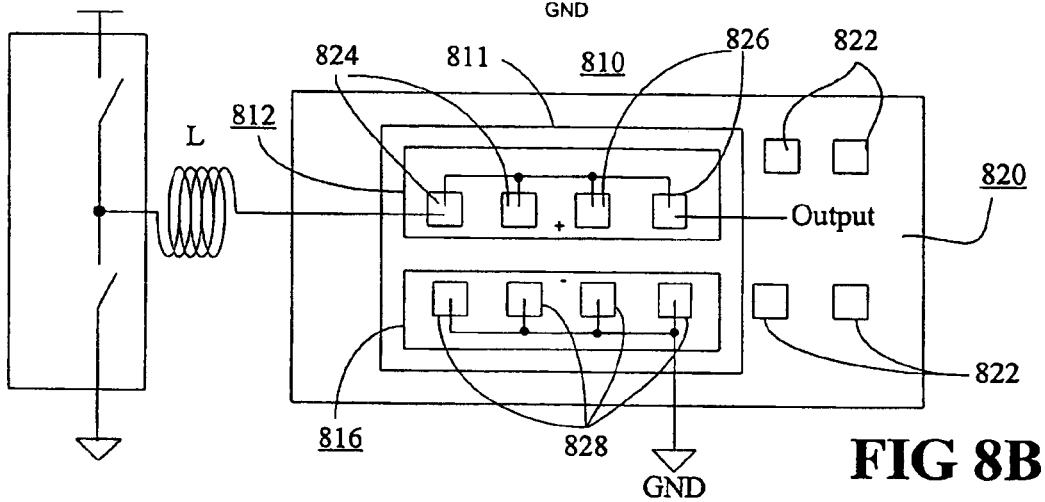
Figure 8C:
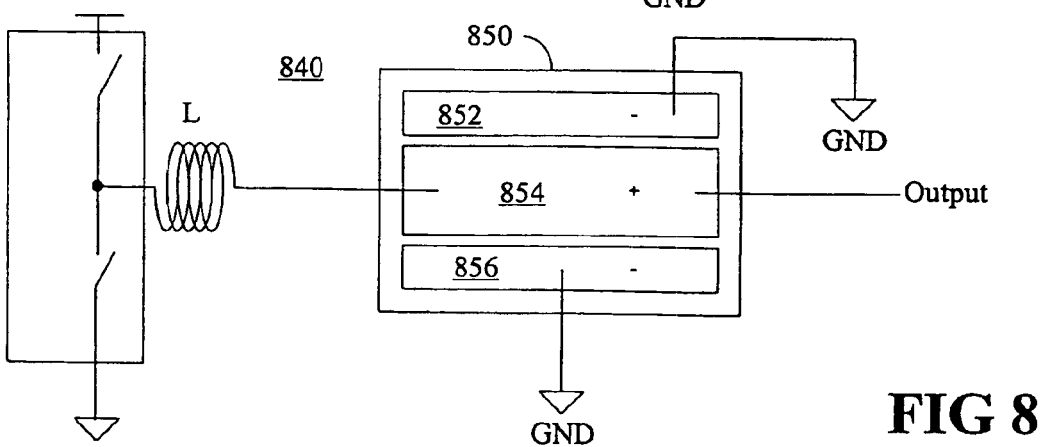

FIGS. 8A–C are configurations illustrating connections of DC-to-DC converters in accordance with embodiments of the present invention. FIG. 8A shows a configuration 800 of an LC configuration such as a DC/DC converter. Configuration 800 includes a capacitor 801, inductor L, and output. Capacitor 801 further includes two external contact bars 802 and 804 wherein a terminal of inductor L is connected to one end of contact bar 802. The output is connected to the other end of contact bar 802. The connection of contact bar 802 corresponds to the connection of node A shown in FIG. 7A. In an alternative embodiment, capacitor 801 has two connect pads of one polarity in which the left hand portion of the top bar 802 is connected to the output of the inductor L of the DC/DC voltage regulator and the right hand portion of the top bar 802 is connected to the output of the voltage regulator. The lower finger 804 is connected to reference voltage potential.

FIG. 8B is an alternative embodiment. Configuration 810 illustrates a connection of a DC-to-DC converter mounted on a printed circuit board 820. In one embodiment, printed circuit board 820 includes various vias 822–828. Configuration 810 includes a capacitor 811, inductor L, and output. Capacitor 811 further includes two external contact bars 812–814 wherein contact bars 812–814 are further coupled to a plurality of vias 822. A terminal of inductor L is connected to traces on PCB and then the trace to the via 824 of printed circuit board 820 and an output is connected to another via 826 of printed circuit board 820. It should be apparent to one skilled in the art that it does not depart from the present invention if additional external contact bars are added. The ground or reference voltage is connected to the right hand bar 816 through vias 828.

FIG. 8C illustrates an alternative configuration 840 including a capacitor 850, which further includes three external contact bars 852–856. Contact bar 854 provides a voltage potential of one polarity while contact bars 852, 856 provide a ground or reference voltage potential to capacitor 850. In certain application contact bar acts as a transmission line and contact bars 852 and 856 provide shielding.

Figure 9A:
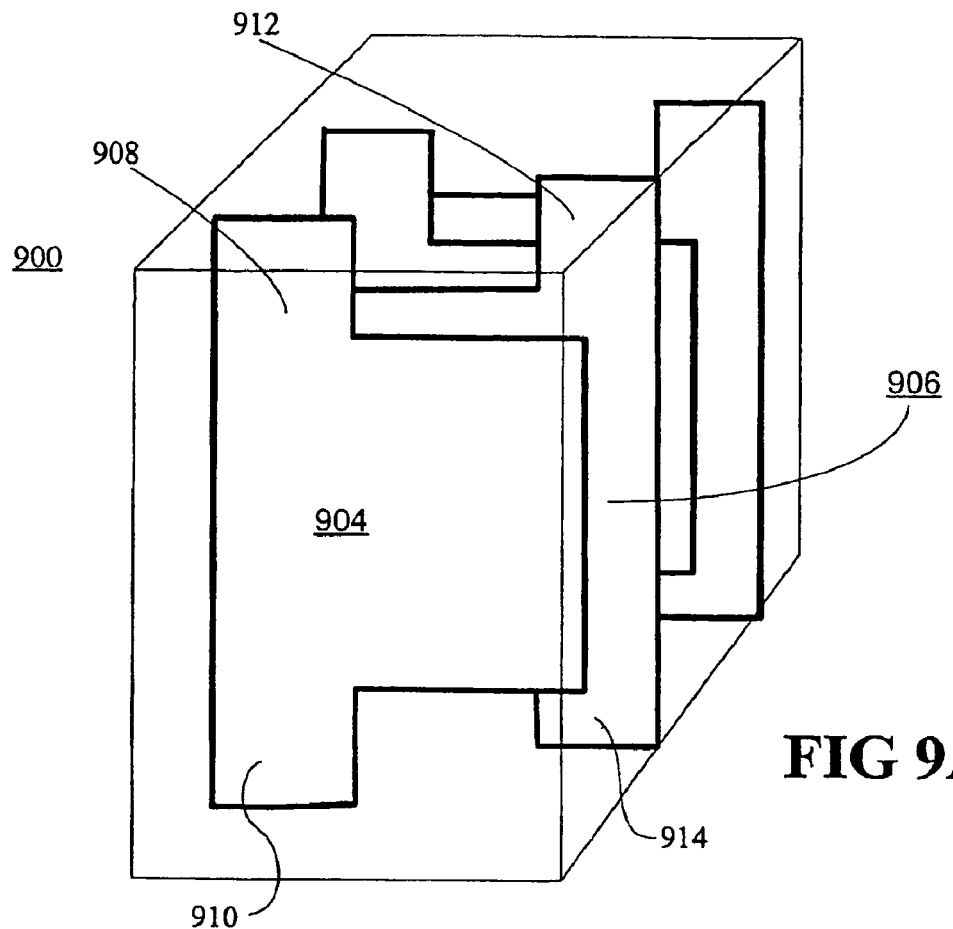
FIGS. 9A–D illustrate a stacking configuration for a multilayer capacitor in accordance with one embodiment of the present invention.

FIGS. 9A–D illustrate a stacking configuration for a multilayer capacitor in accordance with one embodiment of the present invention. FIG. 9A shows a configuration 900 having a first electrode plate 904 and second electrode plate 906. It should be noted that a dielectric material or air gap may be employed between the electrode plates. First electrode plate 904 further includes a top contact finger or extension 908 and bottom contact finger or extension 910. The second electrode plate 906 also includes a top contact finger or extension 912 and bottom contact finger or extension 914. It should be noted that the contact fingers 908–910, 912–914 are not drawn to the scale with respect to electrode plates 904–906.

Figure 9B:
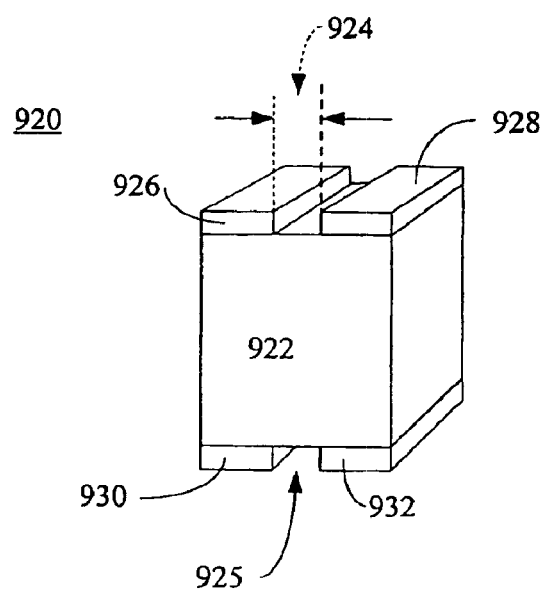

FIG. 9B illustrates a capacitor 920 having external contact bars 926–928 on the top of capacitor 920 and having external contact bars 930–932 at the bottom of capacitor 920. The main body 922 of capacitor 920 includes a plurality of electrode plates 904–906 shown in FIG. 9A. In one embodiment, gaps 924–925 should be kept to a minimum to reduce the parasitic inductance.

Figure 9C:
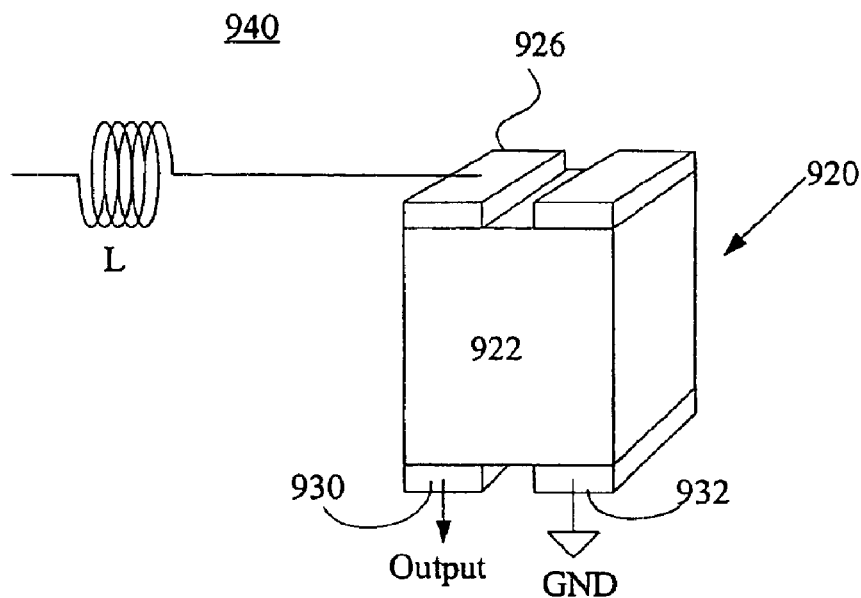

FIG. 9C illustrates a configuration 940 of physical connection between various components for a DC/DC voltage regulator. An output terminal of inductor L is connected to the top external contact bar 926 while the bottom external contact bar 930 is connected to the output terminal. Another external contact bar 932 is connected to the ground or reference voltage potential.

Figure 9D:
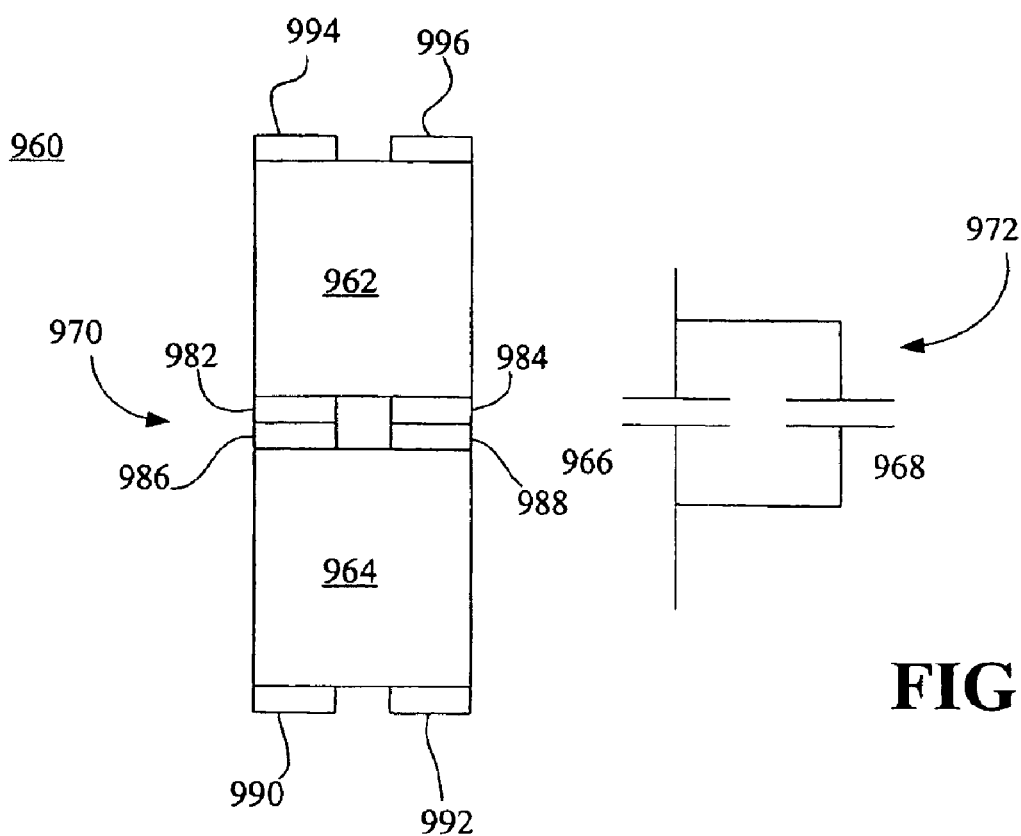

FIG. 9D illustrates a configuration 960 of stacking in which two capacitors 962–964 are stacked together forming a larger capacitor as shown in schematic 972. In one embodiment, the bottom external contact bar 982 of capacitor 962 is connected to the top external contact bar 986 of capacitor 964 while the bottom external contact bar 984 of capacitor 962 is connected to the top external contact bar 988 of capacitor 964 for stacking capacitor 962 and 964. In one aspect, capacitor 966 in schematic 972 could be capacitor 964 and capacitor 968 could be capacitor 962. It should be apparent to one skilled in the art that it does not depart from the present invention if additional capacitors are stacked to capacitor 962 and/or 964.

Figure 10A:
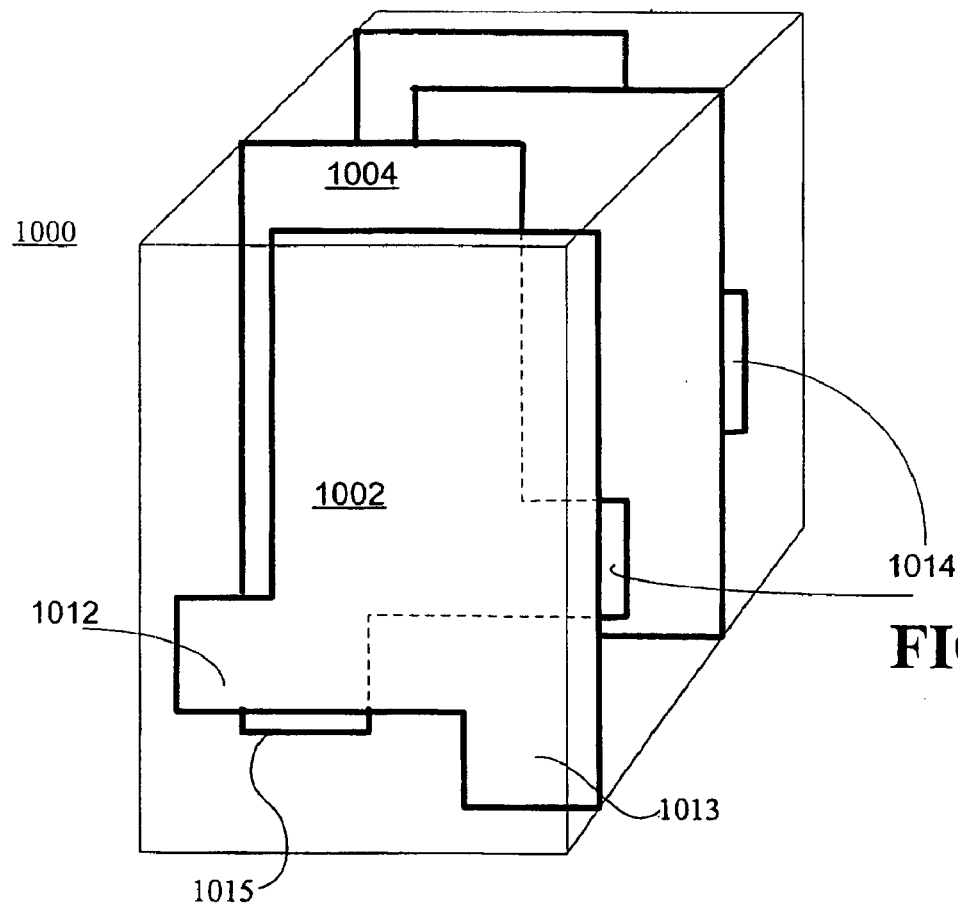
FIGS. 10A–E illustrate a stacking configuration for a multilayer capacitor in accordance with one embodiment of the present invention.

FIGS. 10A–E illustrate a stacking configuration for a multilayer capacitor in accordance with one embodiment of the present invention. FIG. 10A shows a configuration 1000 having a first electrode plate 1002 and a second electrode plate 1004. First electrode plate 1002 further includes a first contact finger or extension 1012 and second contact finger 1013. In one embodiment, first contact finger 1012 extends to the side of capacitor and second contact finger or extension 1013 extends to the bottom of capacitor. It should be noted that the contact fingers 1012–1015 are not drawn to the scale with respect to electrode plates 1002–1004. Second electrode plate 1004 also includes a first contact finger or extension 1014 and second contact finger or extension 1015 wherein first contact finger 1014 extends to the side of capacitor and second contact finger 1015 extends to the bottom of capacitor.

Figure 10B:
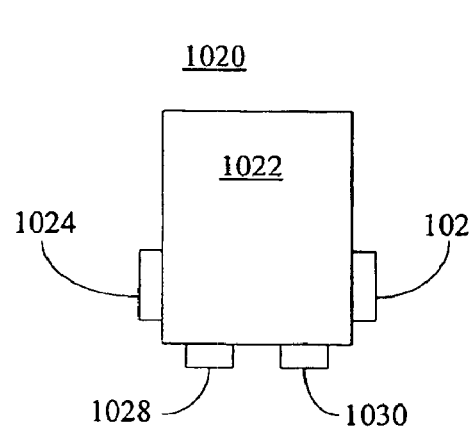

FIG. 10B illustrates a front view of a capacitor 1020 wherein it contains two side contact bars 1024–1026 and two bottom contact bars 1028–1030. The main body 1022 of capacitor 1020 includes a plurality of first and second electrode plates 1002–1004 shown in FIG. 10A. It should be noted that the space between contact bars should be kept to a minimum to reduce the parasitic inductance. In one embodiment, contact bars 1024 and 1030 are terminals of one polarity and contact bars 1026 and 1028 are terminals of the other polarity of capacitor 1020.

Figure 10C:
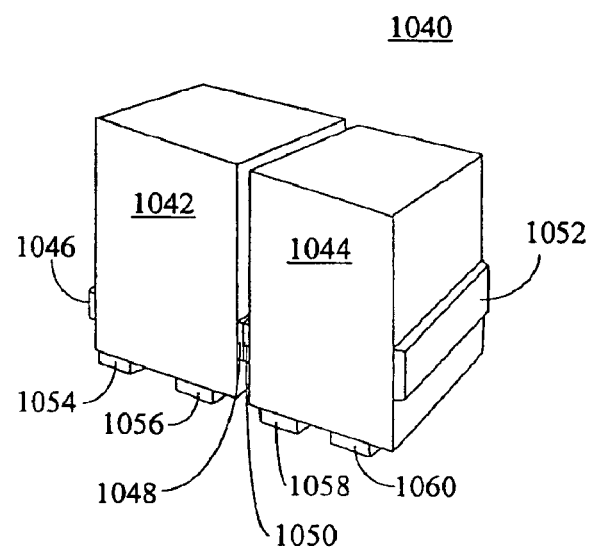
Figure 10D:
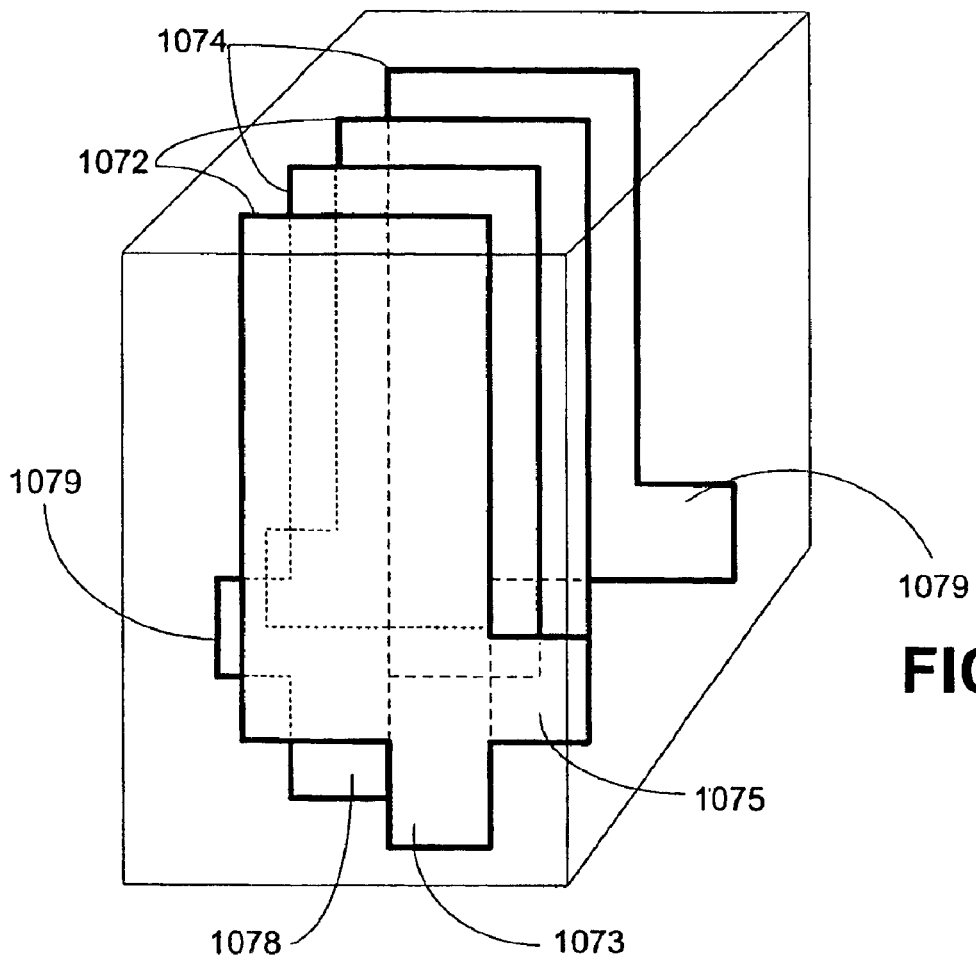

FIG. 10C illustrates a stacking configuration 1040 wherein two capacitors 1042–1044 are stacked together to form a larger capacitance device. In one embodiment, the stacking is accomplished through connecting the external contact bar 1048 of capacitor 1042 to the external contact bar 1050 of capacitor 1044. Other contact bars 1054–1060 may be used to connect to other components such as a printed circuit board FIG. 10D shows a configuration 1070 having first electrode plates 1072 and second electrode plates 1074. First electrode plates 1072 further include first contact fingers 1073 and second contact fingers 1075. In one embodiment, first contact fingers 1073 extend to the bottom of capacitor and second contact fingers 1075 extend to one of the exterior surfaces of the capacitor. Second electrode plates 1074 include first contact fingers 1078 and second contact fingers 1079. First contact fingers 1078 of second electrode plates 1074 extend to the bottom of capacitor and second contact fingers 1079 extend to the other exterior surfaces of capacitor. In one embodiment, first electrode plates 1072 carry charges of one polarity and second electrode plates 1074 carry charges of another polarity. It should be noted that the contact fingers 1073–1079 are not drawn to the scale with respect to electrode plates 1072–1074.

Figure 10E:
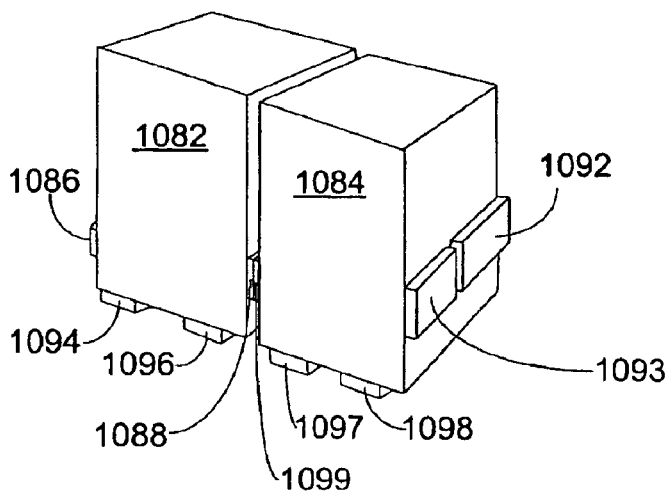

FIG. 10E illustrates a stacking configuration 1080 wherein two capacitors 1082–1084 are stacked together to form a larger capacitance device. In one embodiment, capacitors 1082–1084 are the devices of capacitor 1070 illustrated in FIG 10D. Referring back to FIG 10D and 10E, contact fingers 1075, in one embodiment, are coupled to external contact bar 1093 and contact fingers 1079 are coupled to external contact bar 1092. Moreover, contact fingers 1073 of first electrode plates 1072 are coupled to external contact bar 1098 and contact fingers 1078 of second electrode plates 1074 are coupled to external contact bar 1097. In this embodiment, contact fingers 1093 and 1098 carry charges of one polarity and contact fingers 1092 and 1097 carry charges of another polarity.

In one embodiment, the stacking is accomplished through connecting the external contact bar 1088 of capacitor 1082 to the external contact bar 1099 of capacitor 1084. In this embodiment, capacitors 1082–1084 are connected in parallel. Other contact bars 1094–1098 may be used to connect to other components such as a printed circuit board FIGS. 11A–C illustrate another embodiment of a stacking configuration in a perspective view. FIG. 11A shows a first electrode plate 1102 and a second electrode plate 1104 of a multilayer capacitor. First electrode plate 1102 further includes a first contact finger or extension 1112 and second contact finger or extension 1113. In one embodiment, first contact finger 1112 extends to the left side of the capacitor and second contact finger 1113 extends to the right side of the capacitor. It should be noted that the contact fingers 1112–1114 are not drawn to scale with respect to electrode plates 1102–1104. Second electrode plate 1104 includes a contact finger or extension 1114 that extends to the bottom of the capacitor.

FIG. 11B illustrates a front view of a capacitor 1120 wherein it contains two side contact bars 1124–1126 and one bottom contact bar 1128. The main body 1122 of capacitor 1120 includes a plurality of first and second electrode plates 1102–1104 shown in FIG. 11A. It should be noted that the space between contact bars 1124–1128 should be kept to a minimum to reduce the parasitic inductance. In one embodiment, contact bars 1124 and 1126 are terminals of one polarity and contact bar 1128 is a terminal of the other polarity capacitor 1120.

FIG. 11C illustrates another front view of a capacitor 1120 wherein it contains two side contact bars 1144–1146 and one bottom contact bar 1148. The main body 1142 of capacitor 1140 includes a plurality of first and second electrode plates 1102–1104 shown in FIG. 11A. It should be noted that the front view of capacitor 1120 is similar to the front view of capacitor 1140 except the contact bars 1144–1148, which wrap around the corner of the main body 1142 of the capacitor 1140. The space between contact bars 1144–1148 should be kept to a minimum to reduce the parasitic inductance. In one embodiment, contact bars 1144 and 1146 are terminals of one polarity and contact bar 1148 is a terminal of the other polarity capacitor 1140.

Figure 14A:
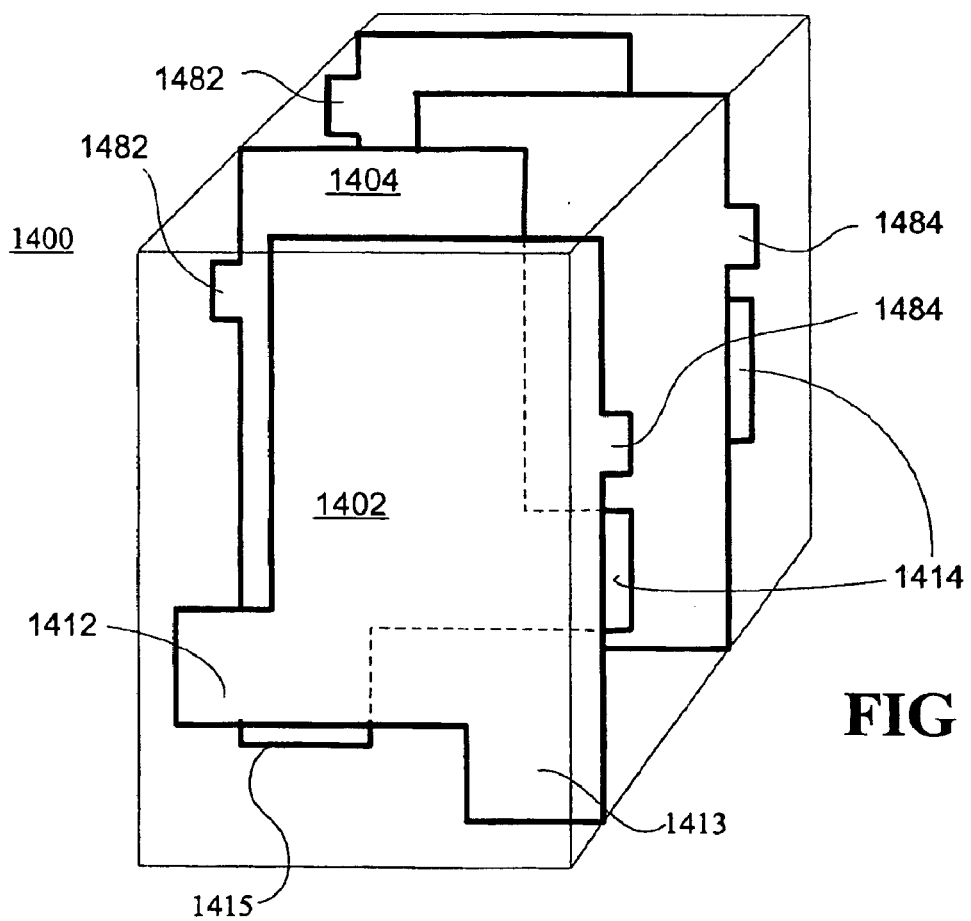
FIGS. 14A–B illustrate another stacking configuration in accordance with one embodiment of the present invention.
Figure 14B:
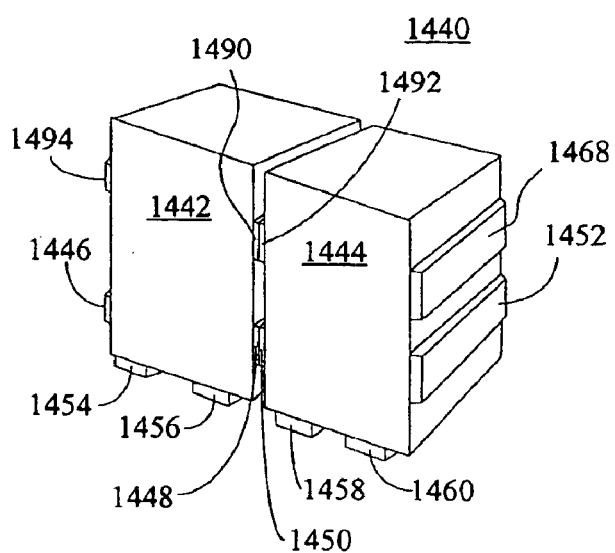

FIGS. 14A–B illustrate a perspective view of another embodiment of a stacking configuration. The embodiment of FIGS. 14A–14B further includes an side electrodes of both polarities as compared to the embodiment in FIGS. 11A–11C. FIG. 14A shows a first electrode plate 1402 and a second electrode plate 1404 of a multilayer capacitor. First electrode plate 1402 further includes a first contact finger or extension 1412, second contact finger or extension 1413 and third contact finger or extension 1484. In one embodiment, first contact finger 1412 extends to the left side of the capacitor, and second contact finger 1413 extends to the bottom of the capacitor and third contact finger 1484 extends the right side of the capacitor. It should be noted that the contact fingers are not drawn to scale with respect to electrode plates 1402–1404. Second electrode plate 1404 includes a first contact finger or extension 1482, second contact finger or extension 1418 and third contact finger or extension 1482. As shown therein first contact finger 1482 extends to the left side of the capacitor, and second contact finger 1415 extends to the bottom of the capacitor and third contact finger 1414 extends the right side of the capacitor.

FIG. 14B illustrates a stacking configuration 1440 wherein two capacitors 1442–1444 are stacked together to form a capacitance device. In one embodiment, capacitors 1442–1444 are the devices of capacitor 1402 illustrated in FIG. 14A. Referring to capacitor 1444, contact fingers 1484 are coupled to external contact bar 1468, contact fingers 1414 are coupled to external contact bar 1452, contact fingers 1413 are coupled to external contact bar 1460, contact fingers 1415 are coupled to external contact bar 1458, contact fingers 1412 are coupled to external contact bar 1450, and contact fingers 1482 are coupled to external contact bar 1492. Capacitor 1442 is similarly configured. Capacitors 1490 and 1492 are arranged in a side by side configuration, in which capacitor 1442 and 1444 are electrically connected by contact bars 1490 and 1492 being in electrical communication and contact bars 1448 and 1450 also being in electrical connection. It will be appreciated by those skilled in the art, that additional capacitors may be stacked in this exemplary side-by-side configuration.

While the embodiment shown in FIGS. 14A–B illustrate connecting the capacitors in series, the plate structure can be reconfigured to stack the capacitors in a parallel manner.

Figure 12A:
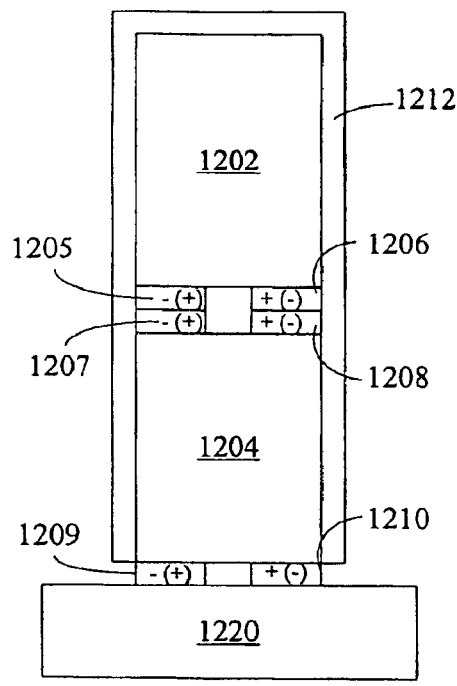
FIGS. 12A-B illustrate a capacitor having a cap in accordance with one embodiment of the present invention.
Figure 12B:
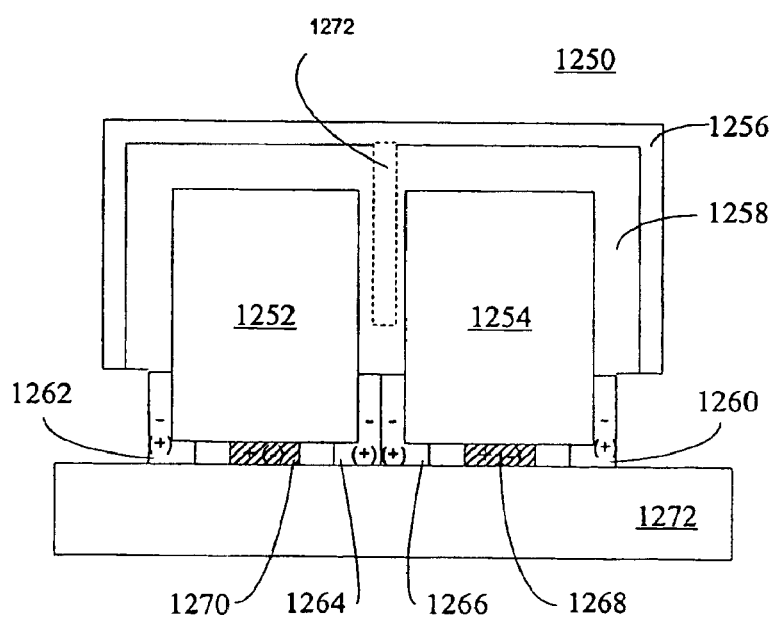

FIGS. 12A–B illustrate capacitors having caps in accordance with embodiments of the present invention. FIG. 12A illustrates a configuration 1200 showing stacked capacitors with a cap 1212 in accordance with one embodiment of the present invention. Configuration 1200 includes two capacitors 1202–1204, a cap 1212, and a printed circuit board 1220. Capacitor 1204, in one embodiment, includes a plurality of external contact bars 1207–1210 wherein external contact bars 1207–1208 are on the top of capacitor 1204 and external contact bars 1209–1210 are on the bottom of capacitor 1204. Capacitor 1204 is connected to printed circuit board 1220 via contact bars 1209–1210 while capacitor 1202 is stacked on top of capacitor 1204 via contact bars 1205–1208.

In one embodiment, cap 1212, also known, as the housing, holder, and/or thermal dissipater, these terms will be used interchangeably herein, provides a function of dissipating heat generated by capacitors 1202–1204. Cap 1212 may include special internal and external fins, which are not shown in FIG. 12A. The internal fins are used to dissipate thermal heat between the stacked capacitors 1202–1204. It should be noted that the capacitor may tend to become hot if it is running at high frequencies.

In one embodiment, radial structured capacitors can be placed into a holder 1212 for vertical stacking to build a bigger capacitor. Holder or cap 1212 may be made of plastic compound. Alternatively, holder 1212 may be made of extruded aluminum materials. Holder 1212 includes a plurality of fins and they are used to provide heat conduction path to the outer surface area of holder 1212. In another embodiment, holder 1212 may be constructed using extruded aluminum with internal chambers wherein each chamber is designed to fit individual capacitors. It should be noted that thermal dissipation is vital when capacitors are running at high speed.

FIG. 12B illustrates a configuration 1250 showing capacitors in stacking form in a holder 1256 in accordance of one embodiment of the present invention. Configuration 1250 includes two capacitors 1252–1254, a holder, container, housing or cap 1256, and a printed circuit board 1270. Capacitor 1252, in one embodiment, includes a plurality of external contact bars 1262–1264 and 1270 wherein external contact bars 1262–1264 extend to the sides of capacitor 1252 while external contact bar 1270 extends to the bottom of capacitor 1270. Capacitor 1254 is similar to capacitor 1252 and they are stacked horizontally.

Holder 1256, which may be made of thermal conductive materials, may be used to dissipate thermal heat generated by capacitors 1252–1254. In addition, holder 1256 facilitates the stacking of capacitors 1252–1254. In one embodiment, the space 1258 between the holder 1256 and capacitors 1252–1254 is filled with thermal conductive materials for dissipating heat more effectively. Alternatively, an optional element 1278 is provided to dissipate heat from the capacitors.

It is within the scope and spirit of this invention that the stacked capacitor arrangement of FIGS. 9D and 10C to include the various external terminal arrangements as illustrated, for example, in FIGS. 6A–6D.

It is further contemplated that the 1256 that holder 1256 may include any suitable container, magazine and the like made of any appropriate material. The holder may be fabricated by an injection molding process or the stacked capacitors be secured together to each other by an encapsulation process. Any appropriate number of capacitors to be stacked may be utilized.

Figure 13:
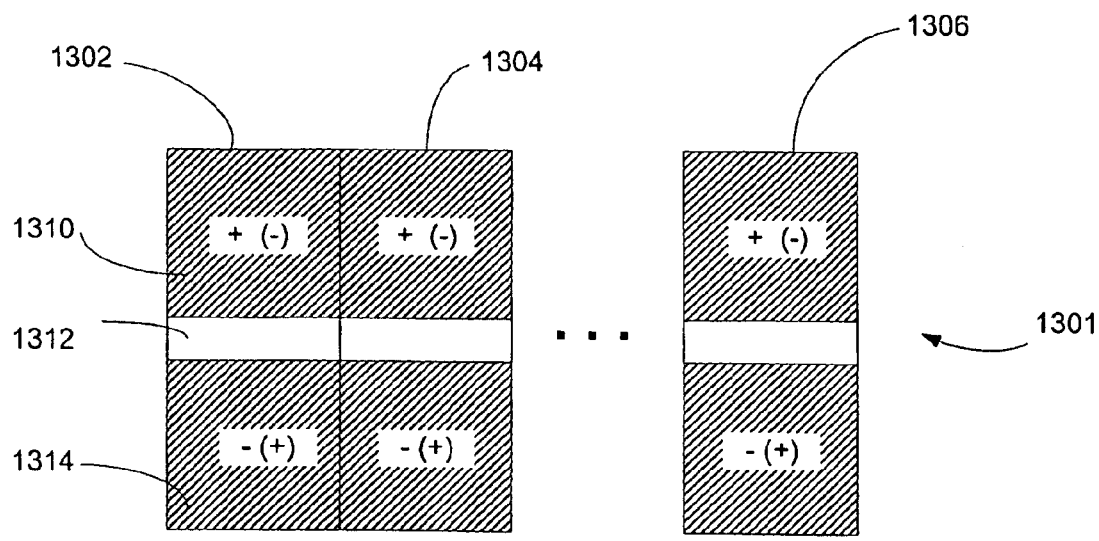
FIG. 13 illustrates a stacking structure of multiple capacitors in accordance with one embodiment of the present invention.
Figure 13:
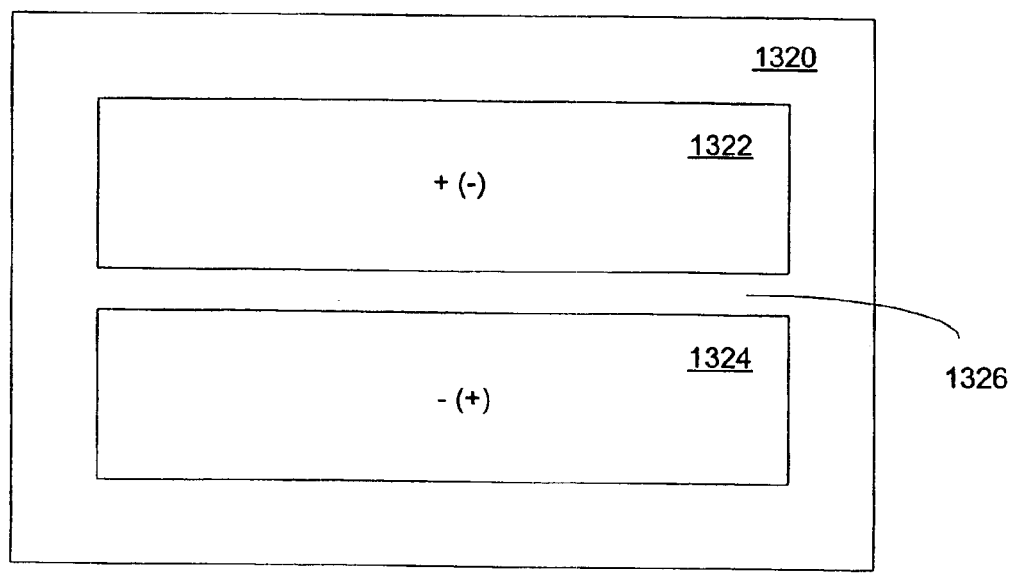

FIG. 13 illustrates a stacking configuration 1300 of multiple capacitors in accordance with one embodiment of the present invention. Configuration 1300 includes a bottom view 1301 of multiple capacitors and a top view of a printed circuit board ("PCB") 1320. The bottom view 1301 includes external contact bars 1310–1314 of multiple capacitors 1302–1306. Each bottom view includes a first polarity terminal 1310 and a second polarity terminal 1314. A space 1312 is provided to separate the terminals 1310 and 1314. In one embodiment, the space 1312 is the minimal distance for reducing the parasitic inductance.

PCB 1320 includes a first contact 1322 and a second contact 1324 wherein the first contact 1322 is, in one embodiment, the positive polarity terminal and the second contact 1324 is the negative polarity terminal. Contacts 1322 and 1324 are separated by a space 1326, which ensures a minimal separation between the contacts 1322 and 1324. In one embodiment, PCB 1320 provides parallel connections for multiple capacitors. For example, contacts 1310 of capacitor 1302–1306 are coupled to first contact 1322 of PBC 1320 and contacts 1314 of capacitor 1302–1306 are coupled to second contact 1324 of PBC. An advantage of parallel connecting multiple capacitors on a PCB is to enhance the yield.

In the foregoing specification the invention has been described with reference to specific exemplary embodiments thereof. It will, however, be evident that various modifications and changes may be made thereto without departing from the broader scope of the invention. The specification and drawings are, accordingly, to be regarded in an illustrative rather than restrictive sense.

What is claimed is:

1. A capacitor that is adapted to be mounted one a substrate, comprising:
   m electrode plates;
   wherein each of said m electrode plates are arranged spaced apart in parallel;
   wherein m is an integer greater than 1;
   wherein each of said m electrode plates comprises a first extension;
   n first external terminals;
   wherein n is an integer greater than 1;
   wherein said n first external terminals are arranged on a first common exterior surface of the capacitor;
   wherein said first extension of even ones of said m electrode plates are coupled to even ones of said n first external terminals;
   wherein said first extension of odd ones of said m electrode plates are coupled to odd ones of said n first external terminals;
   wherein said n first external terminals are arranged at a predefined minimal distance from each other to minimize parasitic inductance,
   wherein when said n first external terminals are connected to the substrate, said m electrode plates of said capacitor are oriented perpendicular to the substrate and wherein a height of said capacitor above the substrate is greater than a width of said capacitor.

2. The capacitor of claim 1, wherein said predefined minimal distance is a minimal distance that prevents crosstalk between said n first external terminals.

3. The capacitor of claim 1, wherein said n first external terminals are arranged in parallel.

4. The capacitor of claim 1, wherein n=2; wherein said n first external terminals are arranged in parallel.

5. The capacitor of claim 1, wherein n=3; wherein said n first external terminals are arranged in parallel and wherein said even one of said n first external terminals is arranged between the odd ones of said n first external terminals.

6. The capacitor of claim 1, wherein a dielectric material is disposed between each of said m electrode plates.

7. The capacitor of claim 6, wherein said dielectric material is ceramic material.

8. The capacitor of claim 1, wherein exterior ones of said n first external terminals are disposed on said common exterior surface of said capacitor and corresponding side surfaces of said capacitor.

9. The capacitor of claim 1,
   wherein each of said m electrode plates comprises a second extension;
   wherein said capacitor comprises s second external terminals;
   wherein s is an integer greater than 1;
   wherein said s second external terminals are arranged on a second common exterior surface of the capacitor;
   wherein said second extensions of said even ones of said m electrode plates are coupled to said even ones of said s second external terminals;
   wherein said second extensions of said odd ones of said m electrode plates are coupled to odd ones of said s second external terminals.

10. The capacitor of claim 9, wherein said second common exterior surface is arranged opposite to said first common exterior surface.

11. The capacitor of claim 9, wherein said second common exterior surface is arranged substantially orthogonal to said first common exterior surface.

12. The capacitor of claim 1,
    wherein each of said m electrodes comprises a second extension;
    wherein the capacitor comprises s second external terminals;
    wherein s is an integer greater than 1;
    wherein even ones of said s second external terminals are arranged on a third exterior surface of the capacitor;
    wherein odd ones of said s second external terminals are arranged on a fourth exterior surface of the capacitor;
    wherein said second extensions of even ones of said m electrode plates are coupled to even ones of said s second external terminals; and
    wherein said second extensions of odd ones of said m electrode plates are coupled to odd ones of said s second external terminals.

13. The capacitor of claim 12, wherein said third exterior surface is arranged opposite to said fourth exterior surface.

14. The capacitor of claim 12, wherein said third and fourth common exterior surfaces are arranged substantially orthogonal to said first common exterior surface.

15. The capacitor of claim 1, further comprising a housing that encloses at least a part of said capacitor.

16. The capacitor of claim 15, wherein said housing is formed from an ejection molding process.

17. The capacitor of claim 1, wherein a portion of at least one of said n first external terminals wraps around a corner of said capacitor.

18. The capacitor of claim 1, wherein said n first external terminals have a bar structure.

19. A printed circuit board ("PCB") comprising:
a plurality of PCB contacts; and
a plurality of capacitors of claim 1 coupled to said plurality of PCB contacts to facilitate parallel connections of at least two capacitors.

20. A circuit comprising:
a printed circuit board ("PCB") including a plurality of PCB contacts longitudinally arranged in parallel; and
a plurality of capacitors wherein each of said capacitors is arranged abutting with each other and mounted on said PCB; wherein each of said plurality of capacitors comprises said capacitor of claim 1.

21. The capacitor of claim 1, wherein each of said m electrodes comprises a second extension;
wherein the capacitor comprises s second external terminals;
wherein s is an integer greater than 1;
wherein even ones of said s second external terminals are arranged on a third exterior surface of the capacitor;
wherein odd ones of said s second external terminals are arranged on the third exterior surface of the capacitor;
wherein said second extensions of even ones of said m electrode plates are coupled to even ones of said s second external terminals; and
wherein said second extensions of odd ones of said m electrode plates are coupled to odd ones of said s second external terminals.

22. The capacitor of claim 21, wherein said odd ones of said s second external terminals are arranged space apart and parallel to said even ones of said s second external terminals.

23. The capacitor of claim 1, further comprising an encapsulation that encloses at least a part of said capacitor.

24. The device of claim 1, wherein the predefined minimal distance is less than 12 mils.

25. The device of claim 1, wherein the predefined minimal distance is less than 8 mils.

26. A system comprising the capacitor of claim 1 and further comprising said substrate, wherein said substrate is a printed circuit board.

27. A capacitor that is adapted to be mounted on a substrate, comprising:
m electrode plates;
wherein each of said m electrode plates are arranged spaced apart in parallel:
wherein m is an integer greater than 3;
wherein each of said m electrode plates comprises a first extension;
n first external terminals;
wherein said n first external terminals are arranged on a first common exterior surface of the capacitor;
wherein said first extension of even ones of said m electrode plates are coupled to even ones of said n first external terminals;
wherein said first extension of odd ones of said m electrode plates are coupled to odd ones of said n first external terminals;
wherein when said n third external terminals are connected to the substrate, said m electrode plates of said first capacitor are oriented perpendicular to the substrate;
wherein said n first external terminals are arranged at a predefined minimal distance from each other to minimize parasitic inductance;
wherein n is 4;
wherein a first one and a second one of said n first external terminals are arranged in a first row;
wherein a third one and a fourth one of said n first external terminals are arranged in a second row;
wherein said first one of said n first external terminals is arranged adjacent said second and fourth ones of said n first external terminals and diagonal to said third one of said n first external terminals; and
wherein said second one of said n first external terminals is arranged diagonal to said fourth one of said n first external terminals.

28. A filter comprising:
an inductor;
a capacitor that is adapted to be mounted on a substrate, comprising:
m electrode plates;
wherein each of said m electrode plates are arranged spaced apart in parallel;
wherein m is an integer greater than 1;
wherein each of said m electrode plates comprises a first extension;
n first external terminals;
wherein n is an integer greater than 1;
wherein said n first external terminals are arranged on a first common exterior surface of the capacitor;
wherein said first extension of even ones of said m electrode plates are coupled to even ones of said n first external terminals;
wherein said first extension of odd ones of said m electrode plates are coupled to odd ones of said n first external terminals;
wherein said inductor is connected to even ones of said n first external terminals;
wherein an output terminal is connected to even ones of said n first external terminals; and
wherein a reference voltage is connected to odd ones of said n first external terminals.

29. The filter of claim 28,
wherein n=3;
wherein said n first external terminals are arranged in parallel and wherein said even one of said n first external terminals is arranged between the odd ones of said n first external terminals;
wherein first and third ones of said n first external terminals are coupled to the reference voltage;
wherein one terminal of said inductor is coupled to a first end portion of a second one of said n first external terminals; and
wherein the output terminal of said filter is provided at a second end portion of said second one of said n first external terminals.

30. The filter of claim 28,
wherein n=2;
wherein said n first external terminals are arranged in parallel;
wherein first one of said n first external terminals is coupled to a reference voltage;
wherein one terminal of said inductor is coupled to a first end portion of a second one of said n first external terminals; and
wherein an output terminal of said filter is provided at a second end portion of said second one of said n first external terminals.

31. A voltage regulator comprising the filter of claim 28.

32. The voltage regulator of claim 31 further comprising a multilayer printed circuit board;
wherein said capacitor is mounted on said multilayer printed circuit board;
wherein said inductor is connected to a first trace of said multilayer printed circuit board;
wherein said first trace is connected to said even ones of said n first external terminals by way of a first plurality of vias;
wherein said output terminal is connected to a second trace on said multilayer printed circuit board;
wherein said second trace is connected to said even ones of said n first external terminals by way of a second plurality of vias;
wherein the reference voltage is connected to a third trace on said multilayer printed circuit board; and
wherein said third trace is connected to said odd ones of said n first external terminals by way of a third plurality of vias.

33. A system comprising the voltage regulator of claim 31 and further comprising said substrate, wherein said substrate is a printed circuit board.

34. A system comprising the filter of claim 28 and further comprising said substrate, wherein said substrate is a printed circuit board.

35. A capacitor structure comprising:
a first capacitor that is adapted to be mounted on a substrate, comprising:
m electrode plates;
wherein each of said m electrode plates are arranged spaced apart in parallel;
wherein m is an integer greater than 3;
wherein each of said m electrodes comprises a first extension;
wherein each of said m electrodes comprises a second extension;
n first external terminals;
wherein n is an integer greater than 1;
wherein said n first external terminals are arranged on a first common exterior surface of said first capacitor;
wherein said first extension of even ones of said m electrode plates are coupled to even ones of said n first external terminals;
wherein said first extension of odd ones of said m electrode plates are coupled to odd ones of said n first external terminals;
s second external terminals;
wherein s is an integer greater than 1;
wherein said s second external terminals are arranged on a second common exterior surface of the first capacitor;
wherein when said n first external terminals are connected to the substrate, said m electrode plates of said first capacitor are oriented perpendicular to the substrate;
wherein said second extension of even ones of said m electrode plates are coupled to even ones of said s second external terminals;
wherein said second extension of odd ones of said m electrode plates are coupled to odd ones of said s second external terminals;
a second capacitor comprising:
x electrode plates;
wherein each of said x electrode plates are arranged in parallel;
wherein x is an integer greater than 1;
wherein each of said x electrodes comprises a third extension;
s third external terminals;
wherein said s third external terminals are arranged on a third common exterior surface of said second capacitor;
wherein said third extension of even ones of said x electrode plates are coupled to even ones of said s third external terminals;
wherein said third extension of odd ones of said x electrode plates are coupled to odd ones of said s third external terminals;
wherein said second capacitor is mounted on said first capacitor; and
wherein said s third external terminals are coupled to corresponding ones of said s second external terminals.

36. The capacitor structure of claim 35, further comprising a housing that encloses at least a part of said first and said second capacitors.

37. The capacitor structure of claim 36, wherein said housing is formed from an ejection molding process.

38. The capacitor structure of claim 36, wherein the housing comprises a fin to dissipate heat from said first and second capacitors.

39. The capacitor structure of claim 35, wherein said n first external terminals are arranged in parallel; wherein said s second external terminals are arranged in parallel; and wherein said s third external terminals are arranged in parallel.

40. The capacitor structure of claim 35, wherein s=2; wherein said s second external terminals are arranged in parallel and wherein said s third external terminals are arranged in parallel.

41. The capacitor structure of claim 35, wherein s=3; wherein said s second external terminals are arranged in parallel and wherein said even one of said s second external terminals is arranged between the odd ones of said s second external terminals and wherein said s third external terminals are arranged in parallel and wherein said even one of said s third external terminals is arranged between the odd ones of said s third external terminals.

42. The capacitor structure of claim 35, wherein a first dielectric material is disposed between each of said m electrode plates of said first capacitor; and wherein a second dielectric material is disposed between each of said x electrode plates of said second capacitor.

43. The capacitor structure of 42, wherein said first and second dielectric material are different.

44. The capacitor structure of 42, wherein said first and second dielectric materials are the same.

45. The capacitor structure of claim 42, wherein at least one of said first dielectric material and said second dielectric material comprises a ceramic material.

46. The capacitor structure of claim 35,
wherein each of said x electrodes plates comprises a fourth extension;
wherein said capacitor comprises u fourth external terminals;
wherein u is an integer greater than 1;
wherein said u fourth external terminals are arranged on a fourth common exterior surface of said second capacitor;

wherein said fourth extensions of said even ones of said x electrode plates are coupled to said even ones of said u fourth external terminals;

wherein said fourth extensions of said odd ones of said x electrode plates are coupled to odd ones of said u fourth external terminals.

47. The capacitor structure of claim 46, wherein said third common exterior surface is arranged opposite to said fourth common exterior surface.

48. The capacitor structure of claim 35, wherein said s second and s third external terminals have a bar structure.

49. The capacitor of claim 35, wherein said second common exterior surface is arranged substantially orthogonal to said first common exterior surface.

50. The capacitor structure of claim 35, further comprising an encapsulation that encloses at least a part of said first and second capacitors.

51. The capacitor structure of claim 35, wherein each of said x electrodes plates comprises a fourth extension;
wherein said capacitor comprises u fourth external terminals;
wherein u is an integer greater than 1;
wherein said u fourth external terminals are arranged on said third common exterior surface of said second capacitor;
wherein said fourth extensions of said even ones of said x electrode plates are coupled to said even ones of said u fourth external terminals;
wherein said fourth extensions of said odd ones of said x electrode plates are coupled to odd ones of said u fourth external terminals.

52. The system comprising the capacitor structure of claim 35 and further comprising said substrate, wherein said substrate is a printed circuit board.

53. A capacitor structure comprising:
a first capacitor that is adapted to be mounted on a substrate, comprising:
m electrode plates;
wherein each of said m electrode plates are arranged spaced apart in parallel;
wherein m is an integer greater than 3;
wherein each of said m electrodes comprises a first extension;
wherein each of said m electrodes comprises a second extension;
n first external terminals;
wherein n is an integer greater than 1;
wherein said n first external terminals are arranged on a first common exterior surface of said first capacitor;
wherein said first extension of even ones of said m electrode plates are coupled to even ones of said n first external terminals;
wherein said first extension of odd ones of said m electrode plates are coupled to odd ones of said n first external terminals;
s second external terminals;
wherein s is an integer greater than 1;
wherein said s second external terminals are arranged on a second common exterior surface of the first capacitor;
wherein when said n first external terminals are connected to the substrate, said m electrode plates of said first capacitor are oriented perpendicular to the substrate;
wherein said second extension of even ones of said m electrode plates are coupled to even ones of said s second external terminals;
wherein said second extension of odd ones of said m electrode plates are coupled to odd ones of said s second external terminals;
a second capacitor comprising;
x electrode plates;
wherein each of said x electrode plates are arranged in parallel;
wherein x is an integer greater than 3;
wherein each of said x electrodes comprises a third extension;
s third external terminals;
wherein said s third external terminals are arranged on a third common exterior surface of said second capacitor;
wherein said third extension of even ones of said x electrode plates are coupled to even ones of said s third external terminals;
wherein said third extension of odd ones of said x electrode plates are coupled to odd ones of said s third external terminals;
wherein said second capacitor is mounted on said first capacitor;
wherein said s third external terminals are coupled to corresponding ones of said s second external terminals;
wherein s is 4;
wherein a first one and a second one of said s second external terminals are arranged in a first row;
wherein a third one and a fourth one of said s second external terminals are arranged in a second row;
wherein said first one of said s second external terminals is arranged adjacent to said second and fourth ones of said s second external terminals and diagonal to said third one of said s second external terminals;
wherein said second one of said s second external terminals is arranged diagonal to said fourth one of said s second external terminals;
wherein a first one and a second one of said s third external terminals are arranged in a first row;
wherein a third one and a fourth one of said s third external terminals are arranged in a second row;
wherein said first one of said s third external terminals is arranged adjacent to said second and fourth ones of said s third external terminals and diagonal to said third one of said s third external terminals; and
wherein said second one of said s third external terminals is arranged diagonal to said fourth one of said s third external terminals.

54. A filter comprising:
an inductor;
a capacitor structure comprising:
a first capacitor comprising:
m electrode plates;
wherein each of said m electrode plates are arranged spaced apart in parallel;
wherein m is an integer greater than 1;
wherein each of said m electrodes comprises a first extension;
wherein each of said m electrodes comprises a second extension;
n first external terminals;
wherein n is an integer greater than 1;
wherein said n first external terminals are arranged on a first common exterior surface of said first capacitor;
wherein said first extension of even ones of said m electrode elates are coupled to even ones of said n first external terminals;

wherein said first extension of odd ones of said m electrode plates are coupled to odd ones of said n first external terminals;
s second external terminals;
wherein s is an integer greater than 1;
wherein said s second external terminals are arranged on a second common exterior surface of the first capacitor;
wherein said second extension of even ones of said m electrode plates are coupled to even ones of said s second external terminals;
wherein said second extension of odd ones of said m electrode elates are coupled to odd ones of said s second external terminals;
a second capacitor comprising;
x electrode plates;
wherein each of said x electrode plates are arranged in parallel;
wherein x is an integer greater than 3;
wherein each of said x electrodes comprises a third extension;
s third external terminals;
wherein said s third external terminals are arranged on a third common exterior surface of said second capacitor;
wherein said third extension of even ones of said x electrode plates are coupled to even ones of said s third external terminals;
wherein said third extension of odd ones of said x electrode plates are coupled to odd ones of said s third external terminals;
wherein said second capacitor is mounted on said first capacitor; and
wherein said s third external terminals are coupled to corresponding ones of said s second external terminals;
wherein said inductor is connected to even ones of said n first external terminals;
wherein an output terminal is connected to even ones of said n first external terminals; and
wherein a reference voltage is connected to odd ones of said n first external terminals.

55. The filter of claim 54, wherein n=3;
wherein said n first external terminals are arranged in parallel and wherein said even one of said n first external terminals is arranged between the odd ones of said n first external terminals;
wherein first and third ones of said n first external terminals are coupled to the reference voltage;
wherein one terminal of said inductor is coupled to a first end portion of a second one of said n first external terminals; and
wherein the output terminal of said filter is provided at a second end portion of said second one of said n first external terminals.

56. The filter of claim 54, wherein n=2;
wherein said n first external terminals are arranged in parallel;
wherein first one of said n first external terminals is coupled to a reference voltage;
wherein one terminal of said inductor is coupled to a first end portion of a second one of said n first external terminals; and
wherein an output terminal of said filter is provided at a second end portion of said second one of said n first external terminals.

57. A voltage regulator comprising the filter of claim 54 further comprising a multilayer printed circuit board; wherein said capacitor structure is mounted on said multilayer printed circuit board;
wherein said inductor is connected to a first trace of said multilayer printed circuit board; and
wherein said first trace is connected to said even ones of said n first external terminals by way of a first plurality of vias;
wherein said output terminal is connected to a second trace on said multilayer printed circuit board;
wherein said second trace is connected to said even ones of said n first external terminals by way of a second plurality of vias;
wherein the reference voltage is connected to a third trace on said multilayer printed circuit board; and
wherein said third trace is connected to said odd ones of said n first external terminals by way of a third plurality of vias.

58. A system comprising the voltage regulator of claim 57 and further comprising said substrate, wherein said substrate is a printed circuit board.

59. A system comprising the filter of claim 54 and further comprising said substrate, wherein said substrate is a printed circuit board.

60. A capacitor structure comprising:
a first capacitor that is adapted to be mounted on a substrate, comprising:
m electrode plates;
wherein each of said m electrode plates are arranged spaced apart in parallel;
wherein m is an integer greater than 3;
wherein each of said m electrodes comprises a first extension and a second extension;
n first external terminals;
wherein n is an integer greater than 1;
wherein said n first external terminals are arranged on a first common exterior surface of said first capacitor;
wherein when said n first external terminals are connected to the substrate, said m electrode plates of said first capacitor are oriented perpendicular to the substrate;
wherein said first extension of even ones of said m electrode plates are coupled to even ones of said n first external terminals;
wherein said first extension of odd ones of said m electrode plates are coupled to odd ones of said n first external terminals;;
s second external terminals;
wherein s is an integer greater than 0;
wherein said s second external terminals are arranged on a second common exterior surface of the first capacitor;
wherein said second extension of even ones of said m electrode plates are coupled to said s second external terminals; and
a second capacitor that is adapted to be mounted on a substrate, comprising:
x electrode plates;
wherein each of said x electrode plates are arranged spaced apart in parallel;
wherein x is an integer greater than 1;
wherein each of said x electrodes comprises a third extension;

s third external terminals;
wherein said s third external terminals are arranged on a third common exterior surface of said second capacitor;
wherein when said s third external terminals are connected to the substrate, said x electrode plates of said first capacitor are oriented perpendicular to the substrate;
wherein said third extension of even ones of said x electrode plates are coupled to said s third external terminals;
wherein said second capacitor is disposed adjacent to said first capacitor;
wherein said s third external terminals are coupled to corresponding ones of said s second terminals.

61. The capacitor structure of claim 60, wherein said n first external terminals are arranged in parallel; wherein said s second external terminals are arranged in parallel; and wherein said s third external terminals are arranged in parallel.

62. The capacitor structure of claim 60, wherein s=2; wherein said s second external terminals are arranged in parallel and wherein said s third external terminals are arranged in parallel.

63. The capacitor structure of claim 60, wherein s=3; wherein said s second external terminals are arranged in parallel and wherein said even one of said s second external terminals is arranged between the odd ones of said n second external terminals and wherein said s third external terminals are arranged in parallel and wherein said even one of said s third external terminals is arranged between the odd ones of said s third external terminals.

64. The capacitor structure of claim 60, wherein a first dielectric material is disposed between each of said m electrode plates of said first capacitor; and wherein a second dielectric material is disposed between each of said x electrode plates of said second capacitor.

65. The capacitor structure of 64, wherein said first and second dielectric material are different.

66. The capacitor structure of 64, wherein said first and second dielectric material are the same.

67. The capacitor of claim 64, wherein at least one of said first second dielectric material and said second dielectric material comprises a ceramic material.

68. The capacitor of claim 60, wherein n first external terminals are arranged in parallel.

69. The capacitor of claim 60, wherein n=2; wherein said n first external terminals are arranged in parallel.

70. The capacitor of claim 60, wherein n=3; wherein said n first external terminals are arranged in parallel and wherein said even one of said n first external terminals is arranged between the odd ones of said n first external terminals.

71. The capacitor of claim 60, wherein said n first external terminals have a bar structure.

72. The capacitor structure of claim 60, wherein at least one of said s second external terminals extend from said second common exterior surface to said first common exterior surface of said first capacitor by wrapping around a corner of said first capacitor.

73. A printed circuit board ("PCB") comprising:
a plurality of PCB contacts; and
a plurality of capacitor structures of claim 60 coupled to said plurality of PCB contacts to provide parallel connections of at least two capacitors.

74. The capacitor structure of claim 60, wherein said second common exterior surface is arranged substantially orthogonal to said first common exterior surface, wherein said third common exterior surface is arranged substantially orthogonal to said fourth common exterior surface.

75. The device of claim 74, wherein said housing is formed from an ejection molding process.

76. A system comprising the capacitor structure of claim 60 and further comprising said substrate, wherein said substrate is a printed circuit board.

77. A capacitor structure comprising:
a first capacitor that is adapted to be mounted on a substrate, comprising:
m electrode plates;
wherein each of said m electrode plates are arranged spaced apart in parallel;
wherein m is an integer greater than 3;
wherein each of said m electrodes comprises a first extension and a second extension;
n first external terminals;
wherein n is an integer greater than 1;
wherein said n first external terminals are arranged on a first common exterior surface of said first capacitor;
wherein when said n first external terminals are connected to the substrate, said m electrode plates of said first capacitor are oriented perpendicular to the substrate;
wherein said first extension of even ones of said m electrode plates are coupled to even ones of said n first external terminals;
wherein said first extension of odd ones of said m electrode plates are coupled to odd ones of said n first external terminals;
s second external terminals;
wherein s is an integer greater than 0;
wherein said s second external terminals are arranged on a second common exterior surface of the first capacitor;
wherein said second extension of even ones of said m electrode plates are coupled to said s second external terminals; and
a second capacitor that is adapted to be mounted on a substrate, comprising:
x electrode plates;
wherein each of said x electrode plates are arranged spaced apart in parallel;
wherein x is an integer greater than 1;
wherein each of said x electrodes comprises a third extension;
s third external terminals;
wherein said s third external terminals are arranged on a third common exterior surface of said second capacitor;
wherein when said s third external terminals are connected to the substrate, said x electrode plates of said first capacitor are oriented perpendicular to the substrate;
wherein said third extension of even ones of said x electrode plates are coupled to said s third external terminals;
wherein said second capacitor is disposed adjacent to said first capacitor;
wherein said s third external terminals are coupled to corresponding ones of said s second terminals;
wherein n is 4;
wherein a first one and a second one of said n first external terminals are arranged in a first row;
wherein a third one and a fourth one of said n first external terminals are arranged in a second row;

wherein said first one of said n first external terminals is arranged adjacent to said second and fourth ones of said n first external terminals and diagonal to said third one of said n first external terminals; and wherein said second one of said n first external terminals is arranged diagonal to said fourth one of said n first external terminals.

78. A filter comprising:

an inductor;

a first capacitor comprising:

m electrode plates;

wherein each of said m electrode plates are arranged spaced apart in parallel;

wherein m is an integer greater than 3;

wherein each of said m electrodes comprises a first extension and a second extension;

n first external terminals;

wherein n is an integer greater than 1;

wherein said n first external terminals are arranged on a first common exterior surface of said first capacitor;

wherein said first extension of even ones of said m electrode plates are coupled to even ones of said n first external terminals;

wherein said first extension of odd ones of said m electrode plates are coupled to odd ones of said n first external terminals;

s second external terminals;

wherein s is an integer greater than 0;

wherein said s second external terminals are arranged on a second common exterior surface of the first capacitor;

wherein said second extension of even ones of said m electrode plates are coupled to said s second external terminals; and a second capacitor that is adapted to be mounted on a substrate, comprising:

x electrode plates;

wherein each of said x electrode plates are arranged spaced apart in parallel;

wherein x is an integer greater than 1;

wherein each of said x electrodes comprises a third extension;

s third external terminals;

wherein said s third external terminals are arranged on a third common exterior surface of said second capacitor;

wherein when said s third external terminals are connected to the substrate, said x electrode plates of said first capacitor are oriented perpendicular to the substrate;

wherein said third extension of even ones of said x electrode plates are coupled to said s third external terminals;

wherein said second capacitor is disposed adjacent to said first capacitor;

wherein said s third external terminals are coupled to corresponding ones of said s second terminals;

wherein said inductor is connected to even ones of said n first external terminals;

wherein an output terminal is connected to even ones of said n first external terminals; and wherein a reference voltage is connected to odd ones of said n first external terminals.

79. The filter of claim 78, wherein n=3;

wherein said n first external terminals are arranged in parallel and wherein said even one of said n first external terminals is arranged between the odd ones of said n first external terminals;

wherein first and third ones of said n first external terminals are coupled to the reference voltage;

wherein one terminal of said inductor is coupled to a first end portion of a second one of said n first external terminals; and wherein the output terminal of said filter is provided at a second end portion of said second one of said n first external terminals.

80. The filter of claim 78, wherein n=2;

wherein said n first external terminals are arranged in parallel;

wherein first one of said n first external terminals is coupled to a reference voltage;

wherein one terminal of said inductor is coupled to a first end portion of a second one of said n first external terminals; and wherein an output terminal of said filter is provided at a second end portion of said second one of said n first external terminals.

81. A voltage regulator comprising the filter of claim 78 further comprising a multilayer printed circuit board; wherein said capacitor structure is mounted on said multilayer printed circuit board;

wherein said inductor is connected to a first trace of said multilayer printed circuit board; and wherein said first trace is connected to said even ones of said n first external terminals by way of a first plurality of vias;

wherein said output terminal is connected to a second trace on said multilayer printed circuit board;

wherein said second trace is connected to said even ones of said n first external terminals by way of a second plurality of vias;

wherein the reference voltage is connected to a third trace on said multilayer printed circuit board; and wherein said third trace is connected to said odd ones of said n first external terminals by way of a third plurality of vias.

82. A system comprising the voltage regulator of claim 81 and further comprising said substrate, wherein said substrate is a printed circuit board.

83. The filter of claim 78, wherein s=1;

wherein said s second external terminal is coupled to even ones of said m electrode plates; and wherein said s third external terminal is coupled to even ones of said x electrode plates.

84. A system comprising the filter of claim 78 and further comprising said substrate, wherein said substrate is a printed circuit board.

85. A device comprising:

a first capacitor that is adapted to be mounted on a substrate, comprising;

m electrode plates;

wherein each of said m electrode plates are arranged spaced apart in parallel;

wherein m is an integer greater than 3;

wherein each of said m electrodes comprises a first extension;

wherein w electrode plates of said m electrode plates comprise a second extension, wherein w is an integer less than m;

n first external terminals;
wherein n is an integer greater than 1;
wherein said n first external terminals are arranged on a first common exterior surface of said first capacitor;
wherein when said n first external terminals are connected to the first capacitor, said m electrode plates of said first capacitor are oriented perpendicular to the substrate;
wherein said first extension of even ones of said m electrode plates are coupled to even ones of said n first external terminals;
wherein said first extension of odd ones of said m electrode plates are coupled to odd ones of said n first external terminals;
s second external terminals;
wherein s is an integer greater than 1;
wherein said s second external terminals are arranged on a second common exterior surface of the first capacitor;
wherein said second extension of even ones of said w electrode plates are coupled to even ones of said s second external terminals;
wherein said second extension of odd ones of said w electrode plates are coupled to odd ones of said s second external terminals;
a second capacitor comprising:
x electrode plates;
wherein each of said x electrode plates are arranged spaced apart in parallel;
wherein x is an integer greater than 1;
wherein y electrode plates of said x electrode plates comprise a third extension;
wherein y is an integer less than x;
q third external terminals;
wherein q is an integer greater than 1;
wherein said q third external terminals are arranged on a third common exterior surface of said second capacitor;
wherein said third extension of even ones of said y electrode plates are coupled to even ones of said q third external terminals;
wherein said third extension of odd ones of said y electrode plates are coupled to odd ones of said q third external terminals;
wherein said second capacitor is disposed abutting and adjacent to said first capacitor;
wherein said even ones of said q third external terminals are coupled to said even ones of said s second terminals; and
wherein said odd ones of said q third external terminals are coupled to said odd ones of said s second terminals.

86. The device of claim 85,
wherein z electrode plates of said m electrode plates comprise a fourth extension;
wherein sum of y and z is integer less than or equal to m;
wherein the first capacitor further comprises f fourth external terminals;
wherein f is an integer greater than 1;
wherein said f fourth external terminals are arranged on a fourth common exterior surface of said first capacitor;
wherein said fourth common exterior surface is opposite to said second common exterior surface;
wherein said fourth extension of even ones of said z electrode plates are coupled to even ones of said f fourth external terminals; and
wherein said third extension of odd ones of said z electrode plates are coupled to odd ones of said f fourth external terminals.

87. The device of claim 85, further comprising a housing that encloses at least a part of said device.

88. The device of claim 85, further comprising an encapsulation that encloses at least a part of said device.

89. A system comprising the device of claim 85 and further comprising said substrate, wherein said substrate is a printed circuit board.

\* \* \* \* \*

UNITED STATES PATENT AND TRADEMARK OFFICE
CERTIFICATE OF CORRECTION

PATENT NO. : 6,950,300 B2  Page 1 of 1
APPLICATION NO. : 10/694306
DATED : September 27, 2005
INVENTOR(S) : Sehat Sutardja It is certified that error appears in the above-identified patent and that said Letters Patent is hereby corrected as shown below:

| | |
|---|---|
| Column 2, Line 29 | Delete "in" after "plate" and add --and is-- |
| Column 4, Line 30 | Insert --of-- after "potential" |
| Column 11, Line 33 | Delete "an" after "includes" |
| Column 11, Line 43 | Insert --to-- after "extends" |
| Column 11, Line 51 | Insert --to-- after "extends" |
| Column 12, Line 43 | Delete "of" and insert --with-- |
| Column 12, Line 66 | Delete "256 that" after "the" |
| Column 13, Line 26 | Delete "PBC" and insert --PCB-- |
| Column 13, Line 27 | Delete "PBC" and insert --PCB-- |
| Column 13, Line 38 | Delete "one" and insert --on-- |
| Column 15, Line 31 | Delete "space" and insert --spaced-- |
| Column 18, Line 52 | Insert --claim-- before "42" |
| Column 18, Line 54 | Insert --claim-- before "42" |
| Column 20, Line 66 | Delete "elates" and insert --plates-- |
| Column 21, Line 13 | Delete "elates" and insert --plates-- |
| Column 23, Line 38 | Insert --claim-- before "64" |
| Column 23, Line 40 | Insert --claim-- before "64" |

Signed and Sealed this

Second Day of January, 2007

JON W. DUDAS
*Director of the United States Patent and Trademark Office*